(12) United States Patent
Hung et al.

(10) Patent No.: US 9,184,128 B2
(45) Date of Patent: Nov. 10, 2015

(54) 3DIC PACKAGE AND METHODS OF FORMING THE SAME

(71) Applicant: Taiwan Semiconductor Manufacturing Company, Ltd., Hsin-Chu (TW)

(72) Inventors: Wensen Hung, Zhubei (TW); Szu-Po Huang, Taichung (TW); Kim Hong Chen, Fremont, CA (US); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/105,718

(22) Filed: Dec. 13, 2013

(65) Prior Publication Data
US 2015/0171006 A1 Jun. 18, 2015

(51) Int. Cl.
*H01L 23/522* (2006.01)
*H01L 21/56* (2006.01)
*H01L 25/065* (2006.01)
*H01L 25/11* (2006.01)
*H01L 25/03* (2006.01)
*H01L 25/00* (2006.01)
*H01L 25/07* (2006.01)

(52) U.S. Cl.
CPC ............ *H01L 23/5226* (2013.01); *H01L 21/56* (2013.01); *H01L 25/0655* (2013.01); *H01L 23/522* (2013.01); *H01L 25/00* (2013.01); *H01L 25/03* (2013.01); *H01L 25/065* (2013.01); *H01L 25/0657* (2013.01); *H01L 25/074* (2013.01); *H01L 25/117* (2013.01); *H01L 2225/06548* (2013.01)

(58) Field of Classification Search
CPC ..... H01L 23/522; H01L 25/065; H01L 25/00; H01L 25/03; H01L 25/074; H01L 25/117; H01L 2225/06548
See application file for complete search history.

(56) References Cited

U.S. PATENT DOCUMENTS

| | | | | |
|---|---|---|---|---|
| 2008/0265434 | A1* | 10/2008 | Kurita | 257/777 |
| 2013/0037950 | A1* | 2/2013 | Yu et al. | 257/738 |
| 2013/0292846 | A1* | 11/2013 | Lee et al. | 257/774 |
| 2014/0353823 | A1* | 12/2014 | Park et al. | 257/737 |

* cited by examiner

*Primary Examiner* — Peniel M Gumedzoe
(74) *Attorney, Agent, or Firm* — Slater & Matsil, L.L.P.

(57) ABSTRACT

A package includes a first molding material, a first device die molded in the molding material, a Through Via (TV) penetrating through the first molding material, and a redistribution line over the first molding material. The redistribution line is electrically connected to the TV. A second device die is over and bonded to the first device die through flip-chip bonding. A second molding material molds the second device die therein.

20 Claims, 32 Drawing Sheets

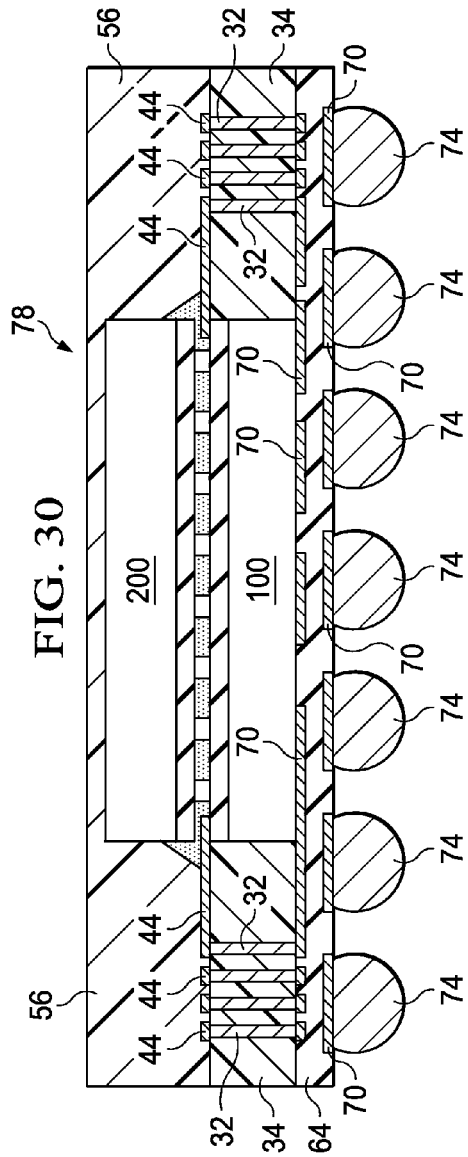
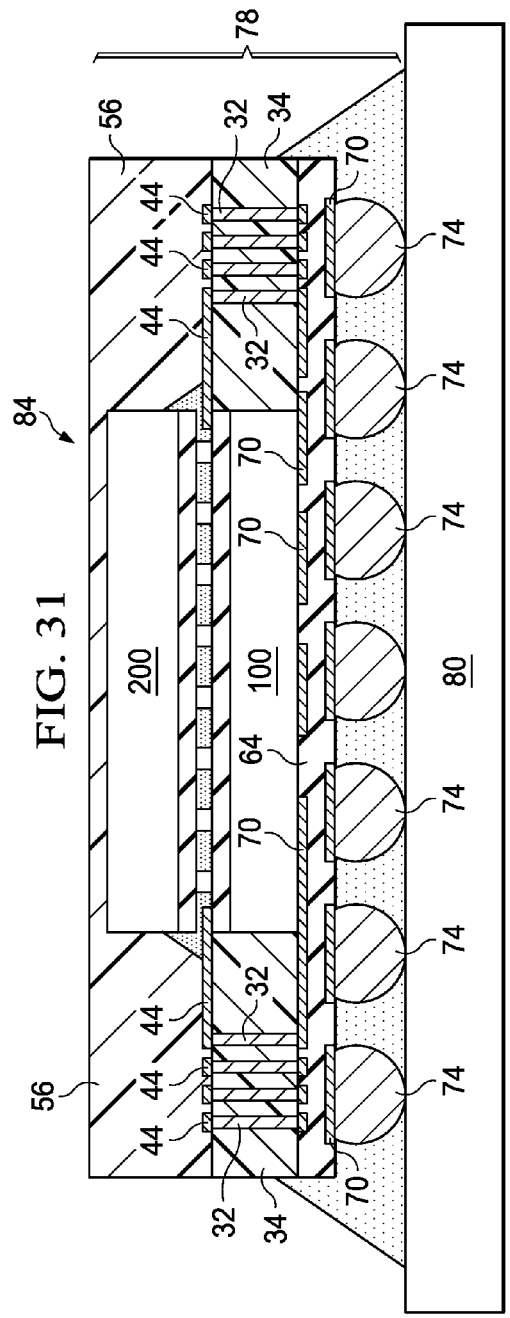

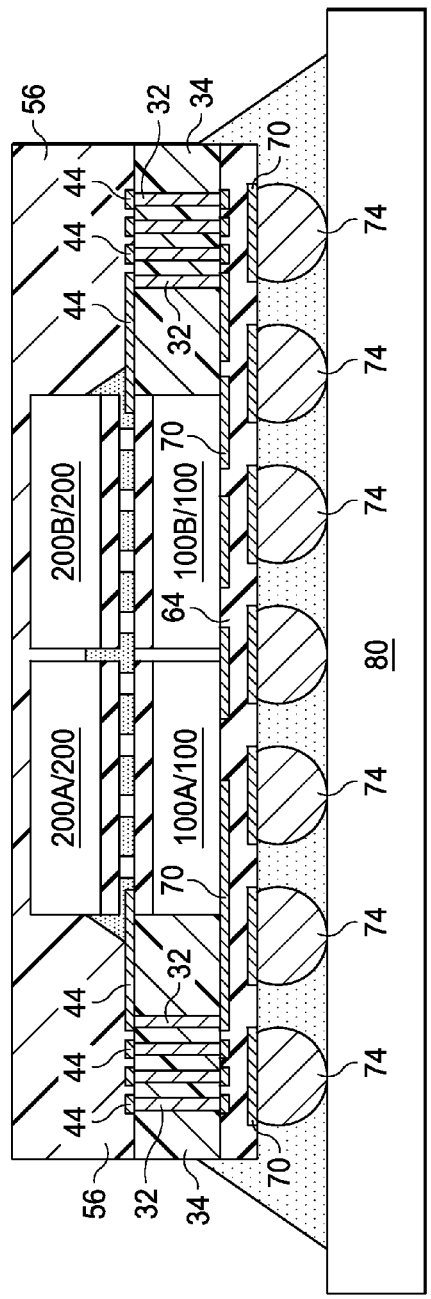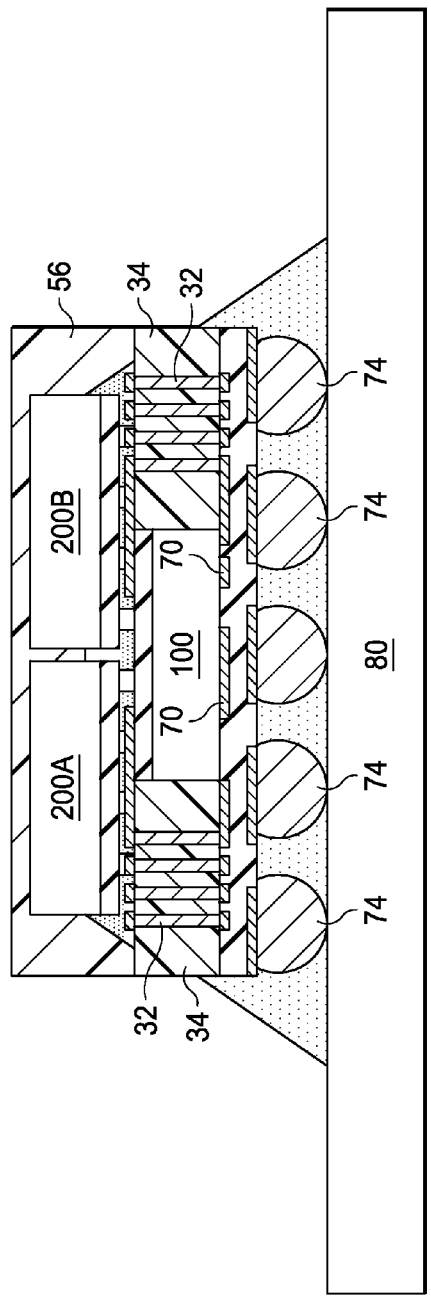

3DIC PACKAGE AND METHODS OF FORMING THE SAME

BACKGROUND

The packaging of integrated circuits, there are a various type of packaging methods and structures. For example, in a conventional Package-on-Package (POP) process, a top package is bonded to a bottom package. The top package and the bottom package may also have device dies packaged therein. By adopting the PoP process, the integration level of the packages may be increased.

In an existing PoP process, the bottom package is formed first, which includes a device die bonded to a package substrate. A molding compound is then molded on the package substrate, wherein the device die is molded in the molding compound. The package substrate further includes solder balls formed thereon, wherein the solder balls and the device die are on a same side of the package substrate. The solder balls are used for connecting the top package to the bottom package. Accordingly, the heights of the solder balls need to be greater than the thickness of the device die, so that the top portions of the solder balls may protrude above the top surface of the device die, and above the top surface of the molding compound. Accordingly, the lateral sizes of the solder balls are also large, and the amount of the solder balls that can be used in a PoP structure is limited.

In another type of packaging, which is known as possum packaging, a first device die is bonded to an overlying second device die. The second device die is bonded to a third device die that is underlying the first die and the second die. Since the bond structure for bonding the first device die and the second device die is misaligned with the bond structures of the second die and the third die, the footprint of the resulting package is large. On the other hand, the second die and the third die have a great distance therebetween since the first device die is disposed between them. The solder balls that bond the second die and the third die are thus large, causing the further increase in the footprint of the resulting package. This also results in the increase in the manufacturing cost.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 30 through 36B are cross-sectional views and top views of various packages in accordance with the embodiments of the present disclosure.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
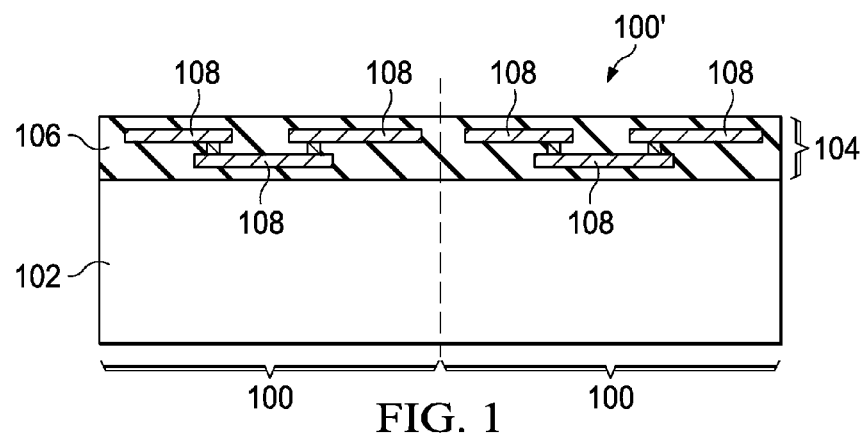
FIGS. 1 through 3 are cross-sectional views of intermediate stages in the preparation of first dies in accordance with some exemplary embodiments.
Figure 2:
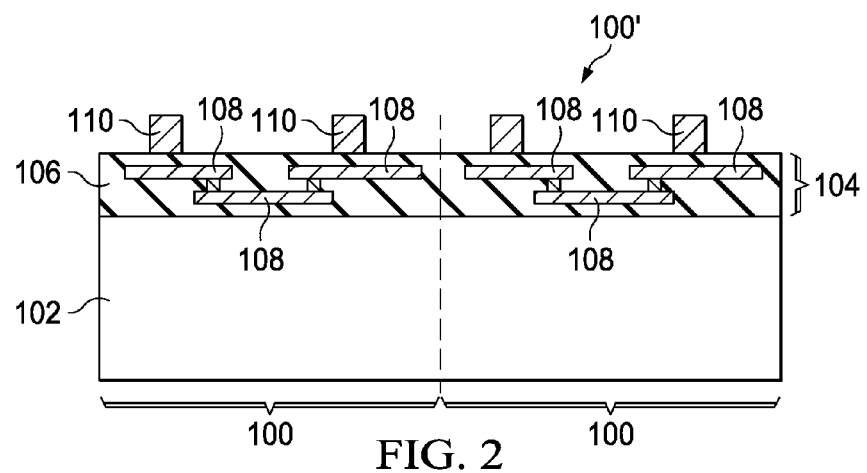
Figure 3:
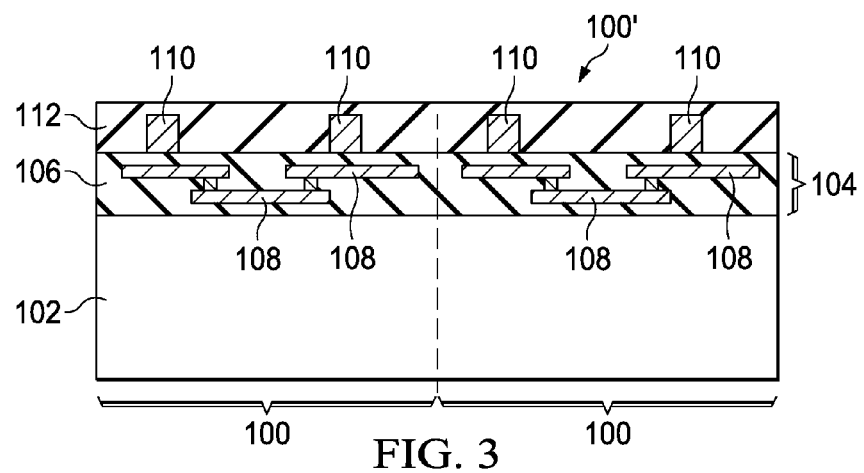

FIGS. 1 through 3 illustrate the preparation of package components 100. In some embodiments, package components 100 are device dies, and hence are referred to as device dies 100 hereinafter, although package components may also be packages in alternative embodiments. Device dies 100 may be parts of an un-sawed semiconductor wafer 100', as shown in FIG. 1, or may be discrete dies that have already been sawed from a wafer. In some embodiments, dies 100 include semiconductor substrate 102, and active devices (not shown) such as transistors formed at the top surface of substrate 102. Semiconductor substrate 102 may be a silicon substrate, a silicon carbon substrate, a silicon germanium substrate, a III-V compound semiconductor substrate, or the like. Interconnect structure 104 is formed over the active devices to electrically connect to the active devices. Interconnect structure 104 includes dielectric layers 106 and metal lines/vias 108 in dielectric layers 106. Dielectric layers 106 may include low-k dielectric layers that have dielectric constants lower than about 3.0, for example.

Referring to FIG. 2, metal pillars 110 are formed, wherein the formation process may include, for example, forming a mask (not shown) such as a photo resist over dies 100 over device dies 100, forming openings to expose the conductive features (not shown) such as metal pads or vias, performing a plating (such as a chemical electrical plating) to form metal pillars 110, and then removing the mask. In some embodiments, metal pillars 110 comprise copper, aluminum, or other applicable metals.

FIG. 3 illustrates the formation of dielectric layer 112 to cover dies 100. Dielectric layer 112 may be, for example, polybenzoxazole (PBO), polyimide, or the like, which is dispensed over dies 100 and then cured. In some embodiments, metal pillars 110 are buried in dielectric layer 112, and are not exposed. A die-saw is performed to saw dies 100 from the respective wafer 100'.

Figure 4:
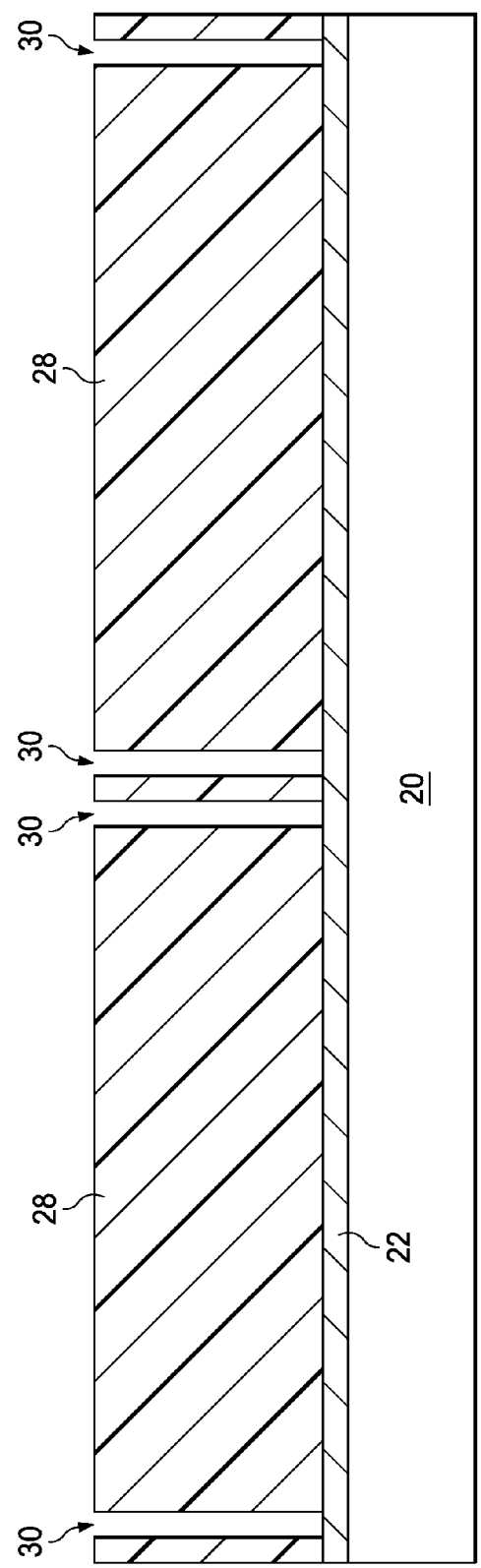
FIGS. 4 through 12 illustrate the formation of Through Vias (TVs) penetrating through a molding compound, the molding of the first dies and the TVs, and the formation of distribution lines in accordance with some embodiments.

FIGS. 4 through 12 are cross-sectional views of intermediate stages in the molding of dies 100, and the formation of Through Vias (TVs, which penetrates through molding compound 34 in FIG. 7) and redistribution lines in accordance with some exemplary embodiments. Referring to FIG. 4, carrier 20 is provided. Carrier 20 may be a blank glass carrier, a blank ceramic carrier, or the like. There may be polymer buffer layer and/or an adhesive (not shown) over carrier 20 in some embodiments. Seed layer 22 is formed over carrier 20, for example, through Physical Vapor Deposition (PVD) or metal foil laminating. Seed layer 22 may comprise copper, copper alloy, aluminum, titanium, titanium alloy, or combinations thereof. In some embodiments, seed layer 22 comprises a titanium layer and a copper layer over the titanium layer. In alternative embodiments, seed layer 22 is a copper layer. Mask layer 28 is formed over seed layer 22. In some embodiments, mask layer 28 comprises a photo resist or a dry film.

Figure 5:
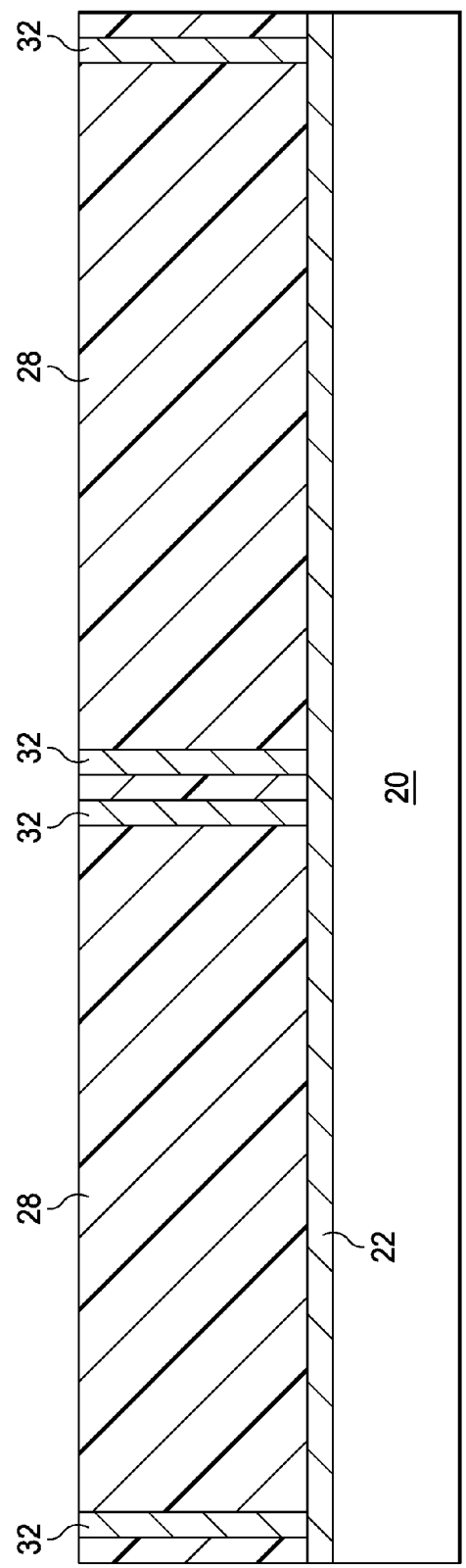
Figure 6:
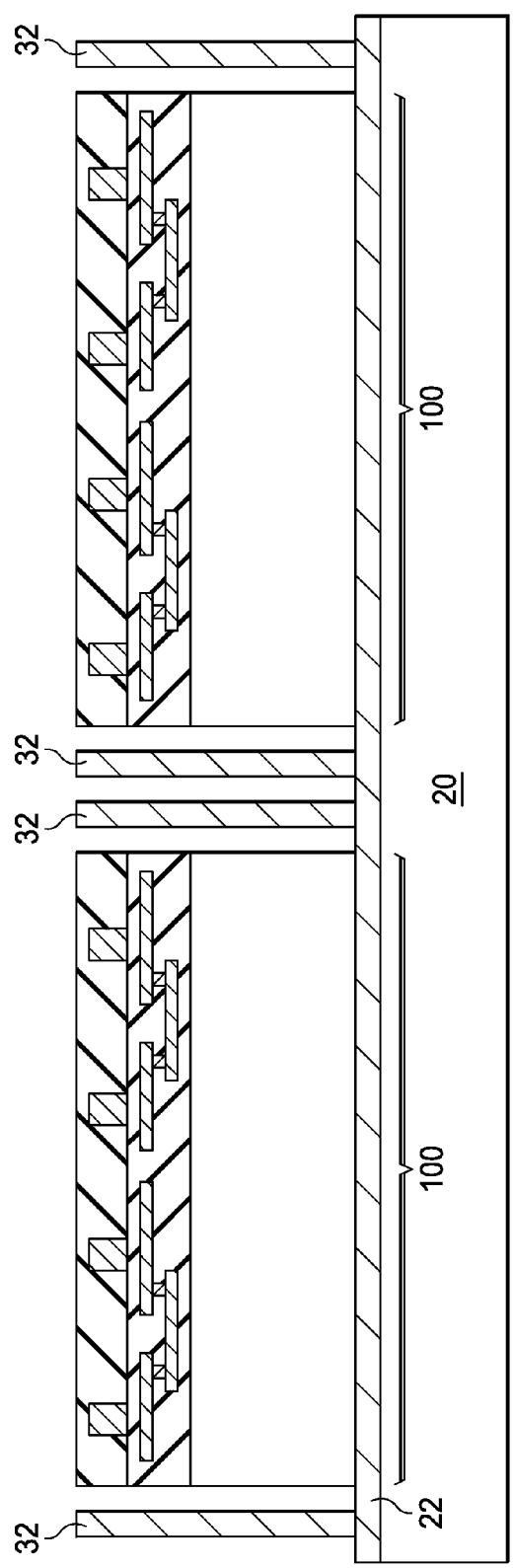

Mask layer 28 is then patterned to form openings 30 in mask layer 28, wherein seed layer 22 is exposed through openings 30. Next, a plating step is performed to form TVs 32, as shown in FIG. 5. TVs 32 may be formed of a non-solder material, and may comprise copper, aluminum, tungsten, nickel, or other metal or metal alloys. Next, mask layer 28 is removed, followed by an etching step to remove the portions of seed layer 22 not covered by TVs 32. The remaining portions of seed layer 22 thus become portions of TVs 32. The resulting TVs 32 are illustrated in FIG. 6. In some embodiments, a TV 32 may have a substantially uniform width and a substantially uniform shape from top to bottom, which forms a rod. Accordingly, the edges of TVs 32 are substantially straight, and are substantially vertical.

FIG. 6 also illustrates the placement of device dies 100 over carrier 20. Device dies 100, which are prepared in the steps shown in FIGS. 1 through 3, may be logic device dies including logic transistors therein. In some exemplary embodiments, device dies 100 are designed for mobile applications, and may be Central Computing Unit (CPU) dies, Power Management Integrated Circuit (PMIC) dies, Transceiver (TRX) dies, or the like.

Figure 7:
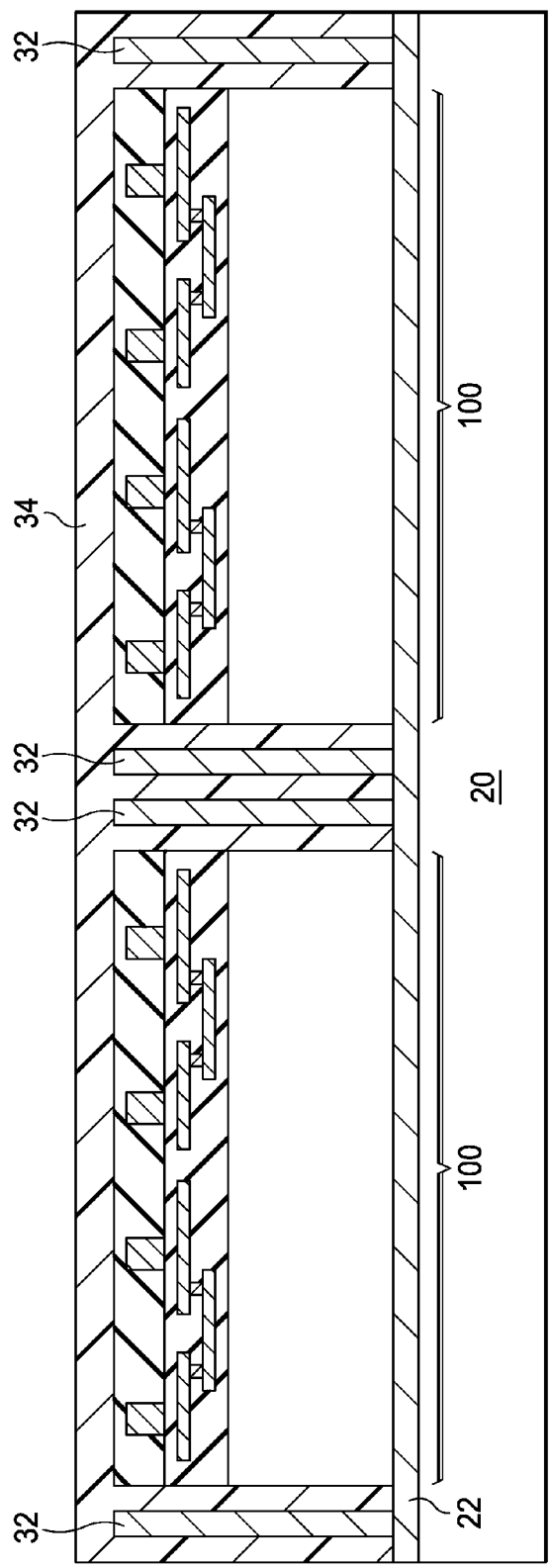

Referring to FIG. 7, molding compound 34 is molded on device dies 100 and TVs 32. Molding compound 34 fills the gaps between device dies 100 and TVs 32. The top surface of molding compound 34 is higher than the top ends of metal pillars 110 and TVs 32.

Figure 8:
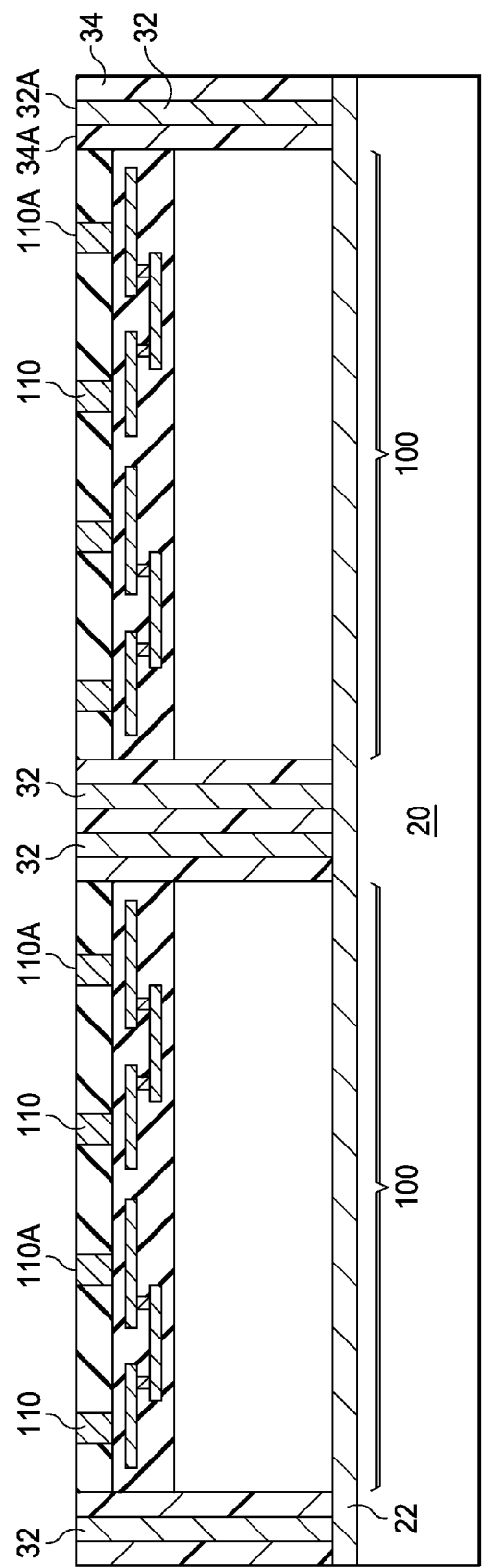

Next, after the curing of molding compound 34, a grinding step is performed to thin molding compound 34, until metal pillars 110 and TVs 32 are exposed. The resulting structure is shown in FIG. 8. Due to the grinding, the top ends 32A of metal features 32 are substantially level (coplanar) with the top ends 110A of metal pillars 110, and are substantially level (coplanar) with top surface 34A of molding compound 34.

Figure 9:
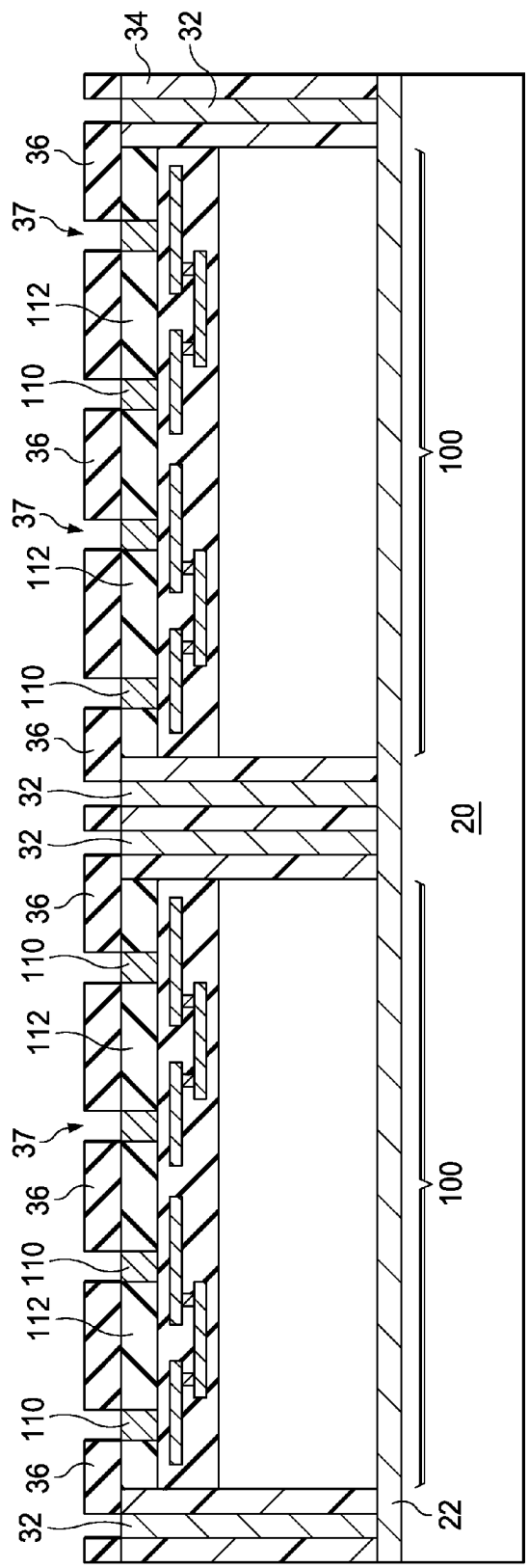
Figure 10:
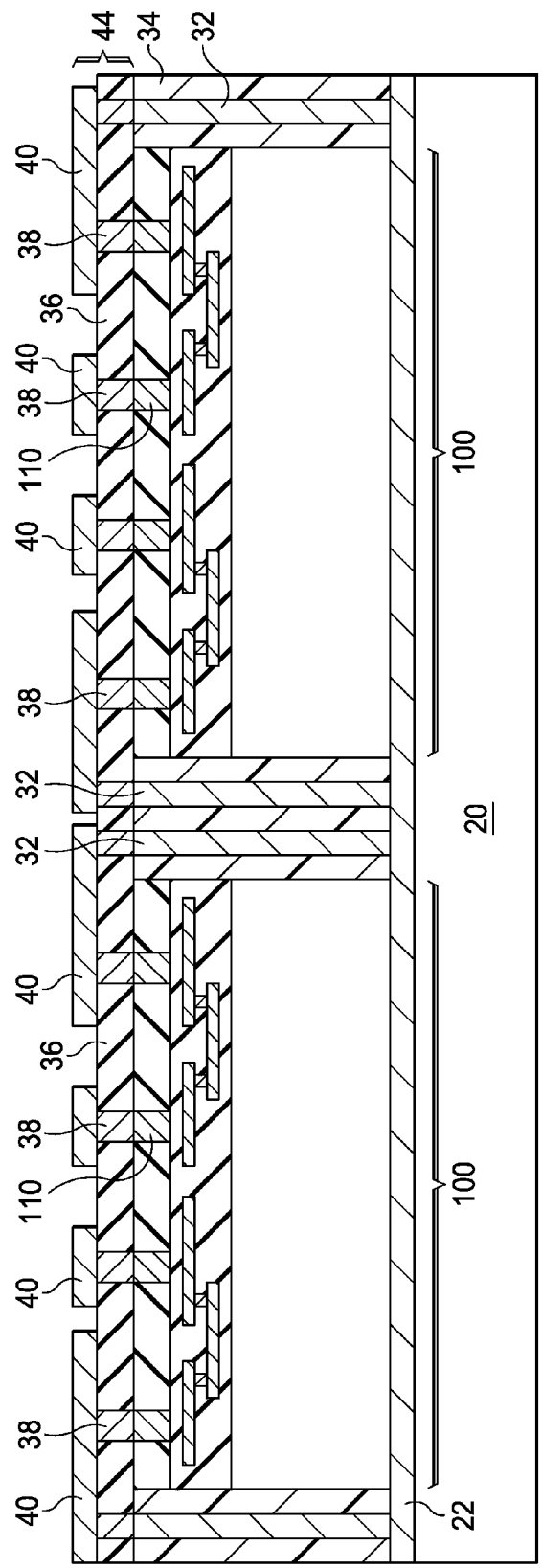

Next, referring to FIGS. 9 through 12, Redistribution Lines (RDLs) are formed over molding compound 34. Referring to FIG. 9, dielectric layer 36 is formed over the structure in FIG. 8. Dielectric layer 36 may be a silicon nitride layer formed at a low temperature, for example, in the range between about 170° C. and about 200° C., so that dielectric layers 112 in dies 100 is not damaged. In alternative embodiments, dielectric layer 36 comprises a polymer such as polyimide, benzocyclobutene (BCB), polybenzoxazole (PBO), or the like. Dielectric layer 36 is then patterned to form openings 37, through which metal pillars 110 and TVs 32 are exposed. Next, referring to FIG. 10, metal vias 38 and metal lines 40 are formed, for example, in a plating process. Metal vias 38 and metal lines 40 are also referred to as RDLs 44 hereinafter. RDLs 44 are electrically connected to, and may also interconnect, metal pillars 110 and TVs 32. RDLs 44 may comprise aluminum, copper, tungsten, and/or alloys thereof.

Figure 11:
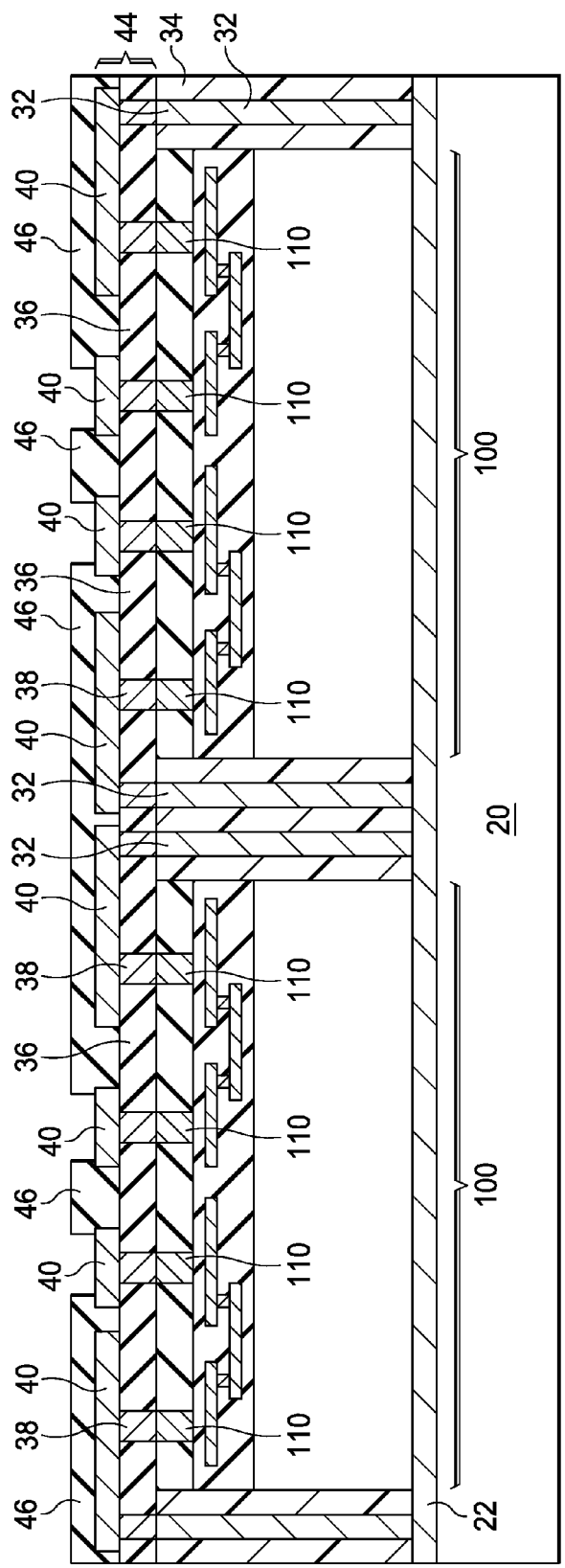
Figure 12:
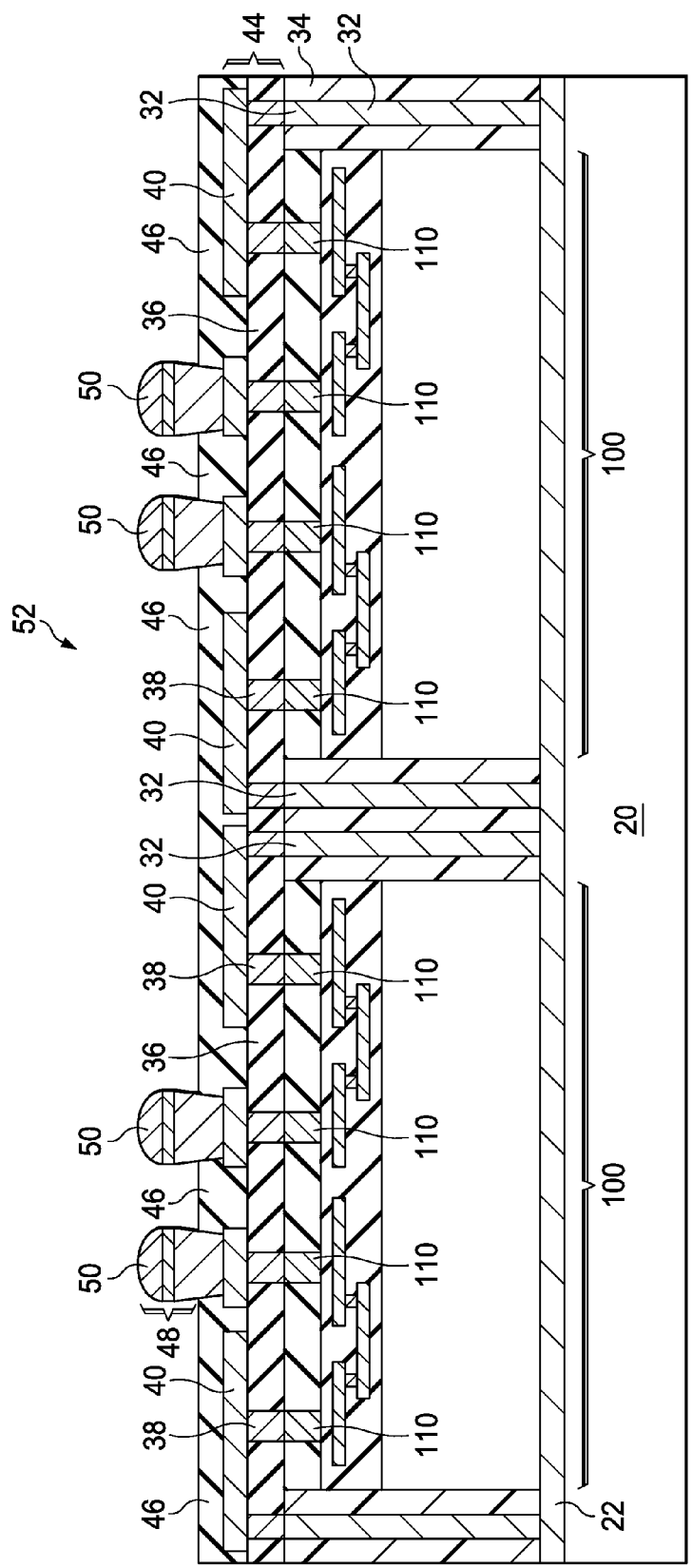

FIGS. 11 and 12 illustrate the formation of dielectric layer 46 (FIG. 1) and electrical connectors 48 (FIG. 12). Dielectric layer 46 may be formed using a material selected from the same candidate materials of dielectric layers 36. Electrical connectors 48 may comprise lead, tin, copper, nickel, aluminum, palladium, gold, alloys thereof, and multi-layers thereof. Electrical connectors 48 may also comprise solder regions 50, which may be plated and then reflowed. Some of electrical connectors 48 are electrically connected to, and may be aligned to, metal pillars 110. Hence, these electrical connectors 48 are essentially the electrical connectors of device dies 100, and act as parts of the respective underlying device dies 100. Throughout the description, the structure in FIG. 12 is referred to as package 52. Although not illustrated, some of electrical connectors 48 may not be electrically connected to dies 100 at this stage. These electrical connectors 48, after bonded to dies 200 in the step shown in FIG. 18, will be electrically connected to TVs 32 through RDLs 44.

Figure 13:
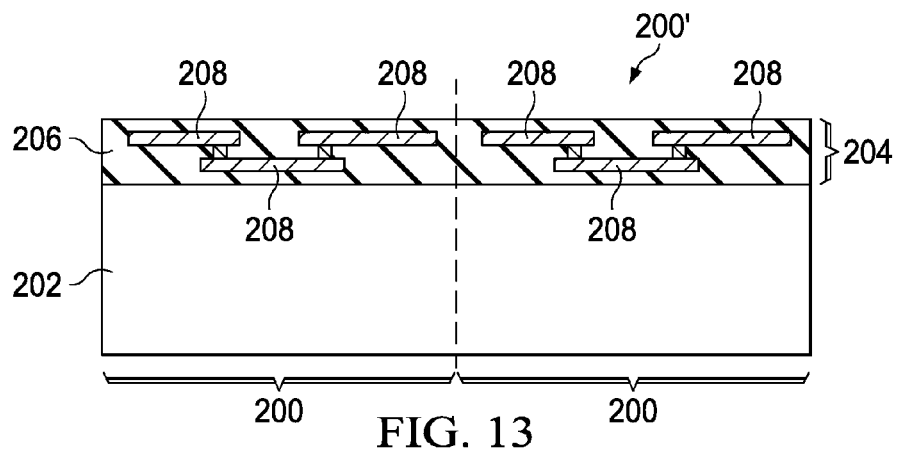
FIGS. 13 through 17 illustrate the cross-sectional views of intermediate stages in the preparation of second dies.

FIGS. 13 through 17 illustrate the preparation of dies 200, which are to be bonded to the package 52 in FIG. 12. Referring to FIG. 13, dies 200 are parts of an un-sawed semiconductor wafer 200'. Dies 200 may be logic dies including logic circuits, memory dies including memories, or the like. In some embodiments, dies 200 include semiconductor substrate 202, and active devices (not shown) such as transistors formed at the top surface of substrate 202. Semiconductor substrate 202 may be a silicon substrate, a silicon carbon substrate, a silicon germanium substrate, a III-V compound semiconductor substrate, or the like. Interconnect structure 204 is formed over, and electrically connected to, the active devices. Interconnect structure 204 includes dielectric layers 206 and metal lines/vias 208 in dielectric layers 206. Dielectric layers 206 may include low-k dielectric layers that have dielectric constants lower than about 3.0, for example.

Figure 14:
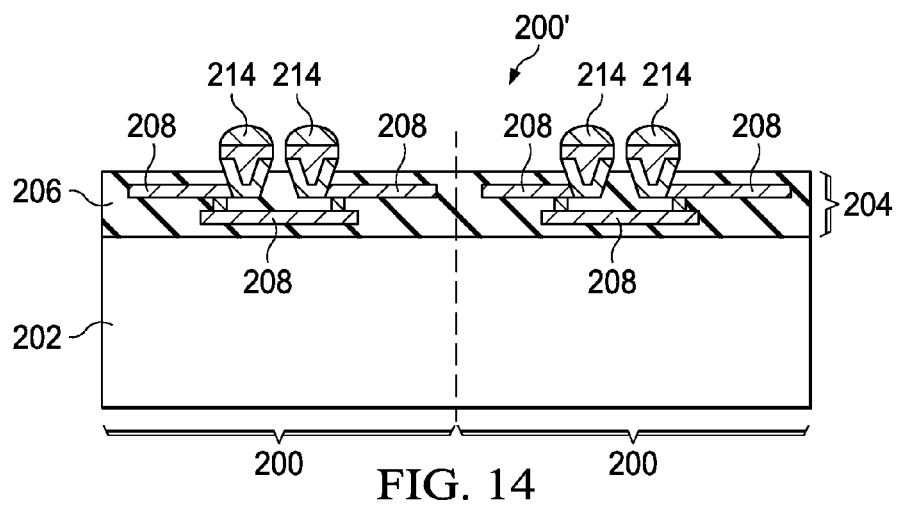

FIG. 14 illustrates the formation of electrical connectors 214, which are electrically connected to metal lines/vias 208 and the devices in dies 200. Electrical connectors 214 may include metal pillars, metal pads, metal pillars with solder layers thereon, or the like.

Figure 15:
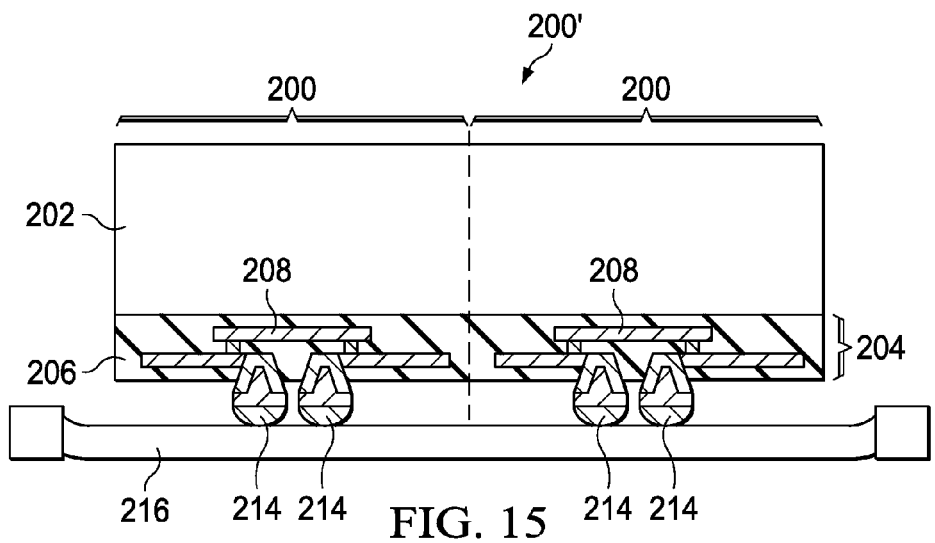
Figure 16:
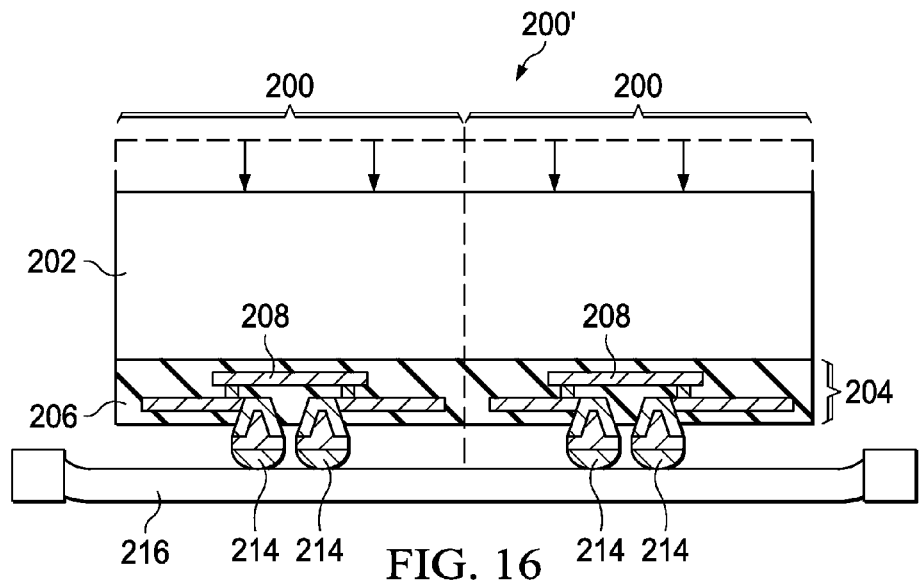
Figure 17:
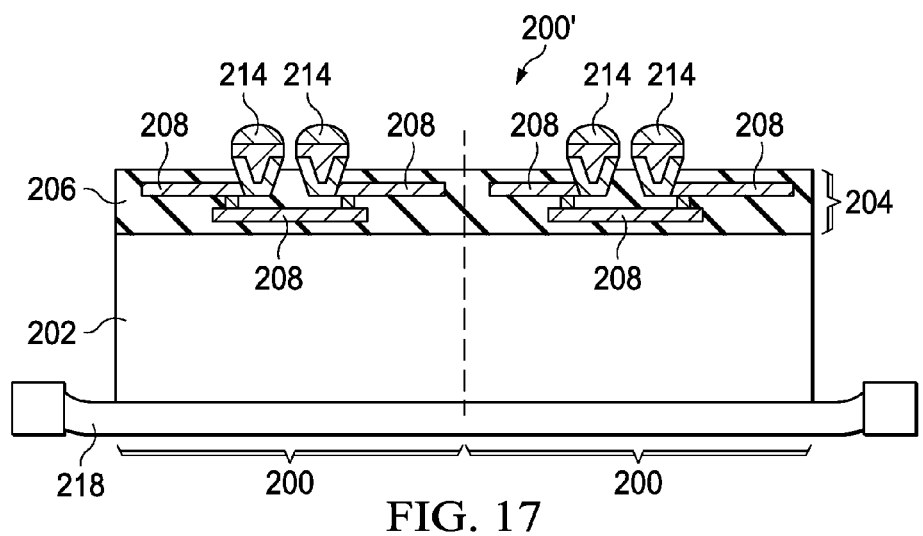

Wafer 200' is then placed on tape 216, as shown in FIG. 15. Next, a backside grinding is performed to thin substrate 202, as shown in FIG. 16. The thinned wafer 200' is then taken off from tape 216, and transferred to tape 218, as shown in FIG. 17, wherein tape 216 and 218 are adhered to opposite sides of wafer 200'. A die-saw step is then performed to saw wafer 200' into dies 200.

Figure 18:
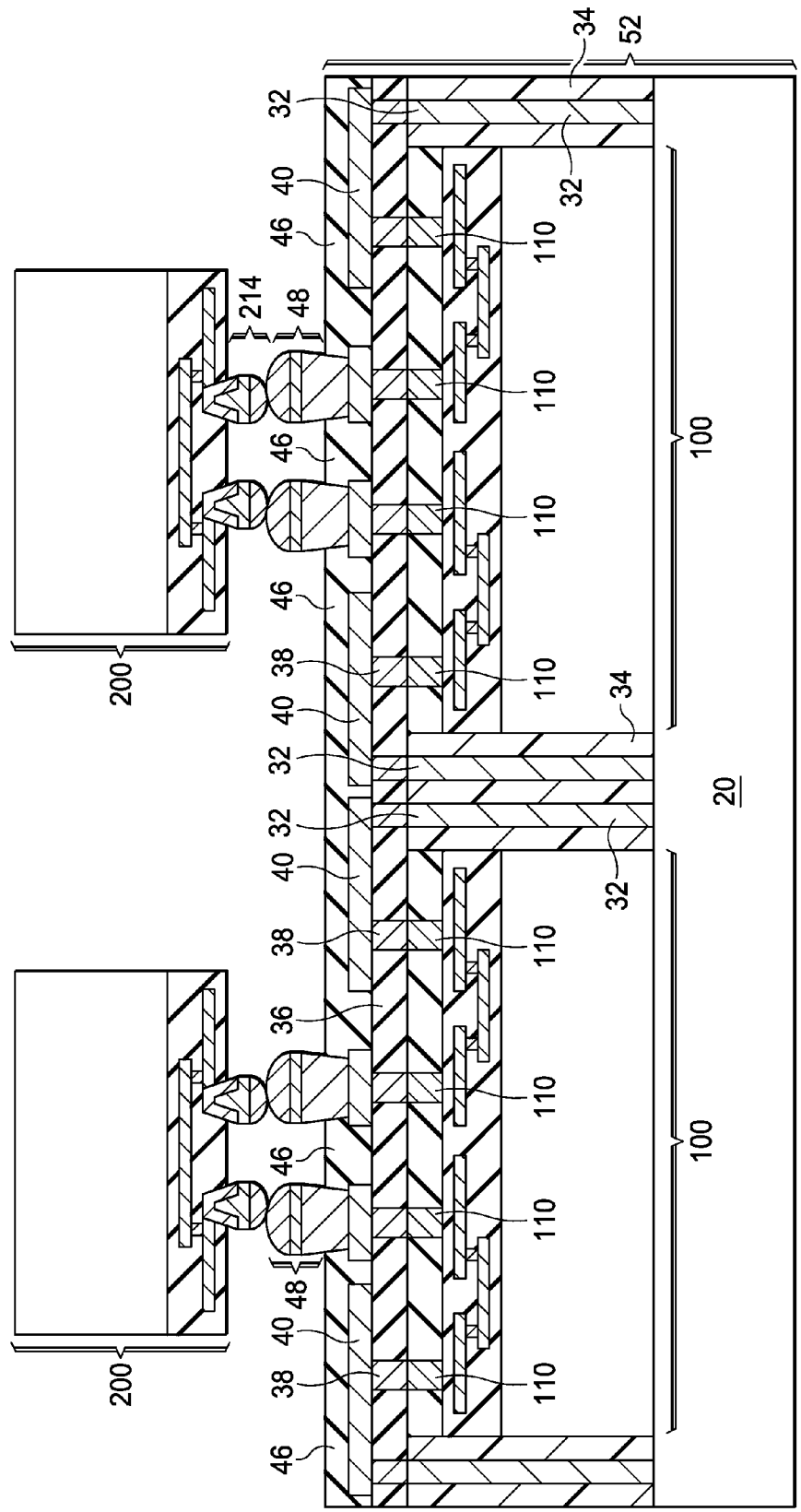
FIGS. 18 through 29 illustrate the cross-sectional views of intermediate stages in the bonding of the second dies to the first dies and the formation of distribution lines in accordance with some embodiments.

FIG. 18 illustrates the bonding of dies 200 to package 52 through flip-chip bonding, wherein electrical connectors 214 in dies 200 are bonded to electrical connectors 48 in package 52. The front sides (the sides with interconnect structures) of dies 100 face the front sides of dies 200. The bonding, depending on the structure of electrical connectors 48 and 214, may be solder bonding or metal-to-metal (such as copper-to-copper) direct bonding.

Figure 19:
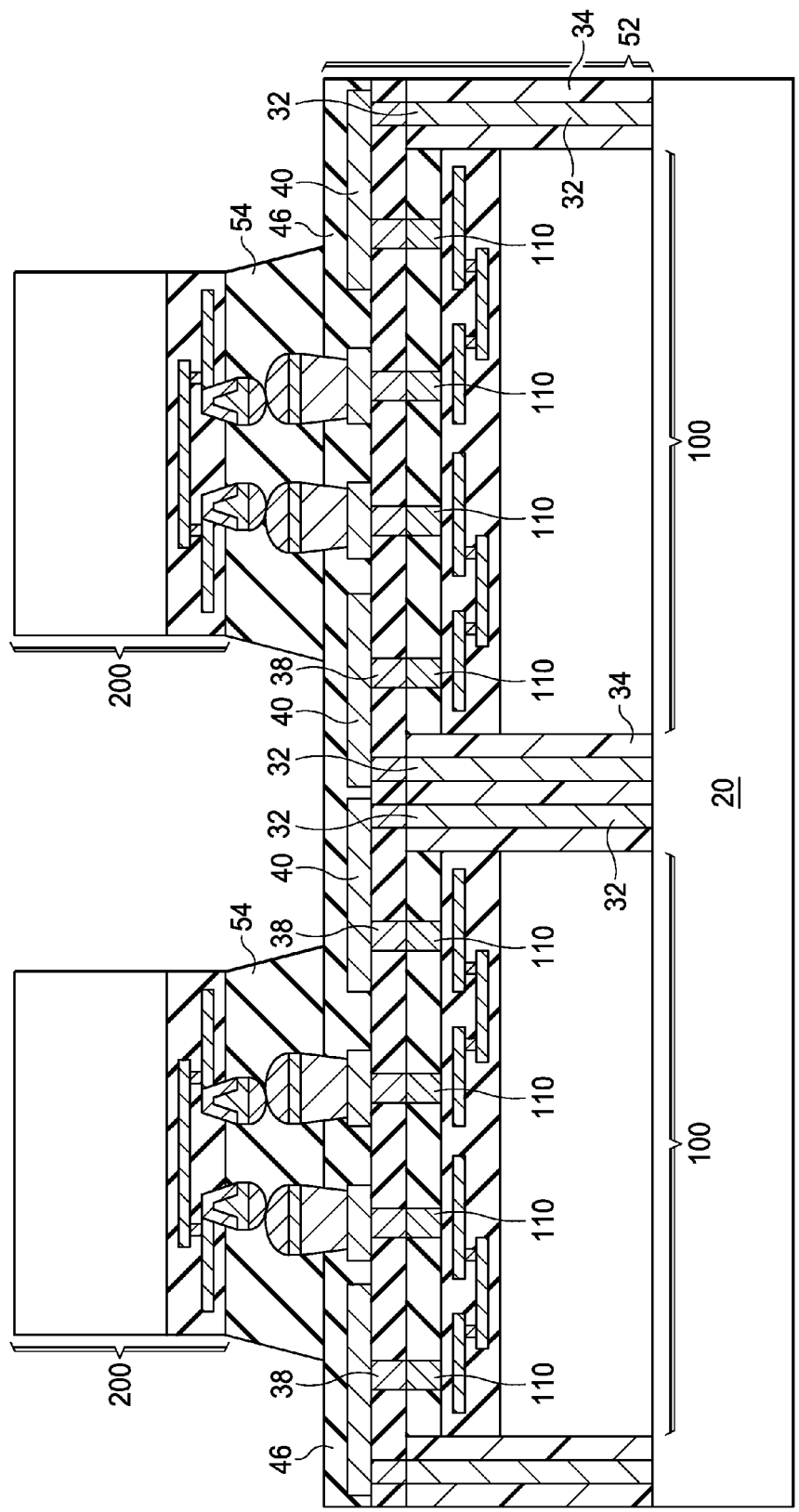
Figure 20:
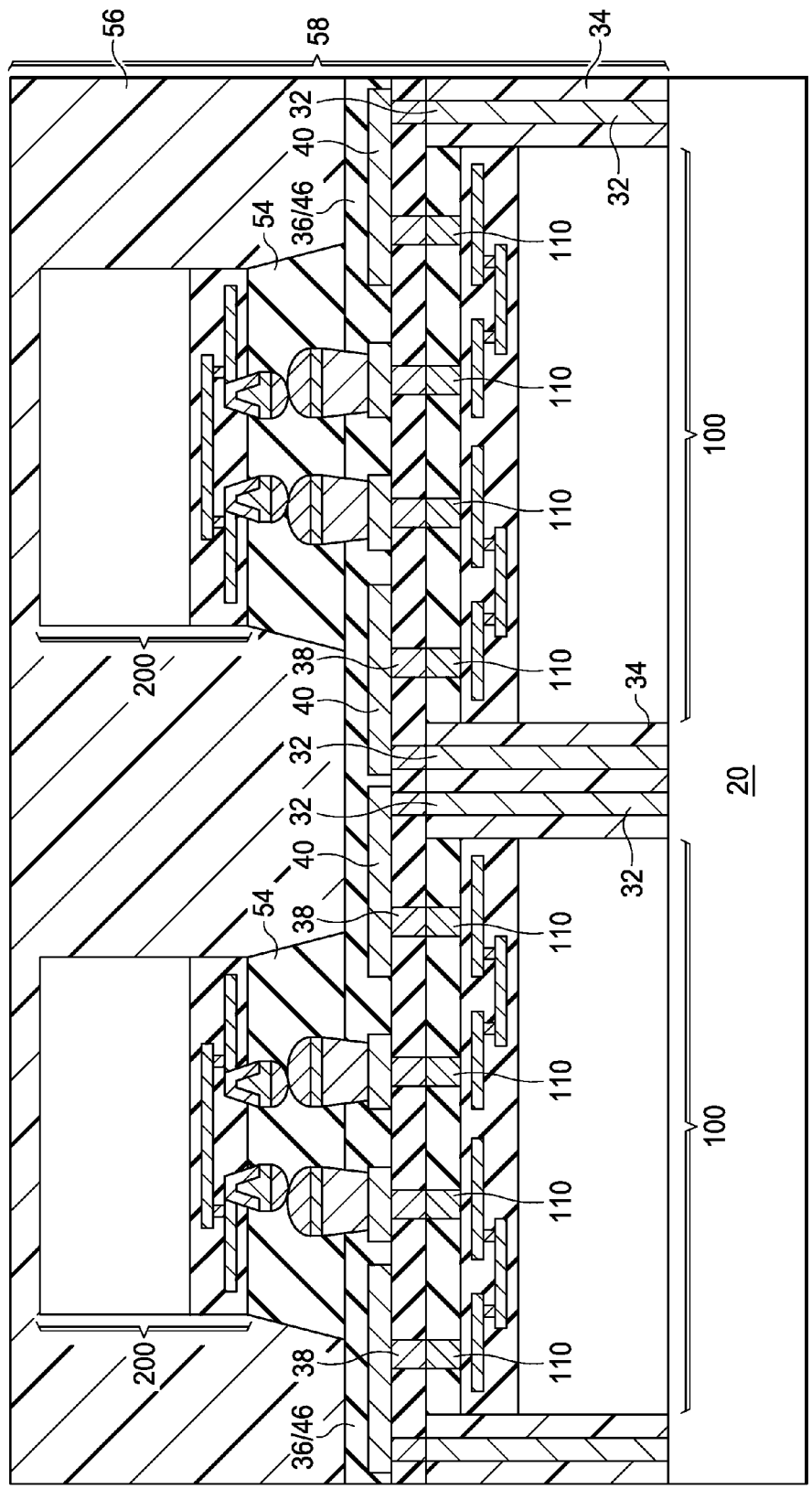

Next, as shown in FIG. 19, underfill 54 is dispensed into the gaps between dies 200 and package 52. Underfill 54 is then cured. Referring to FIG. 20, molding material 56 is then molded on dies 200. Molding material 56 may comprise the same material as that of molding material 34. In alternative embodiments, molding materials 34 and 56 are different from each other. The resulting structure including dies 100 and 200 and molding materials 34 and 56 are referred to as package 58 hereinafter.

Figure 21:
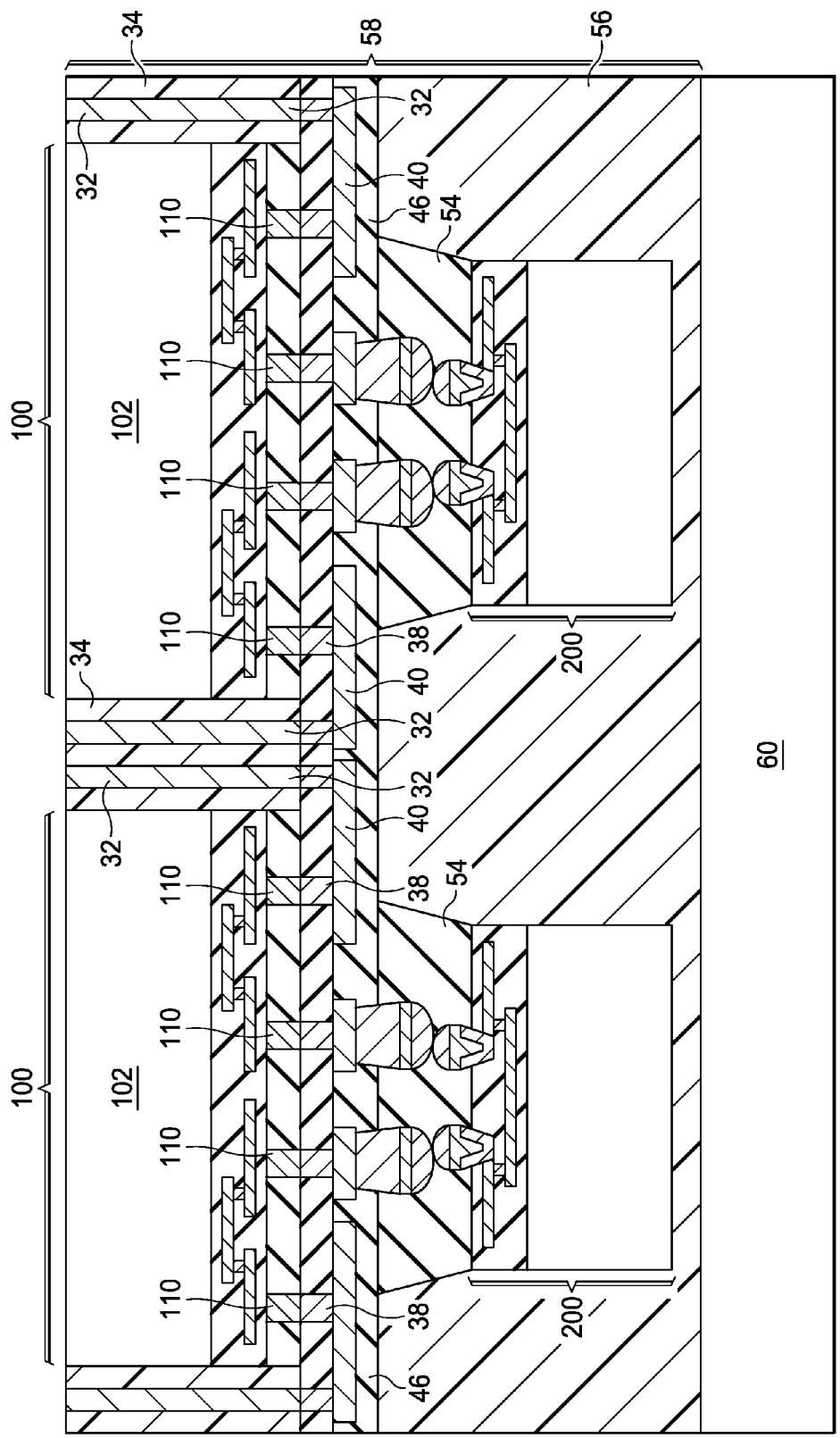

Referring to FIG. 21, a carrier switch is performed, with carrier 20 in FIG. 20 being detached from package 58. Package 58 is then mounted on carrier 60. The respective adhesive for attaching package 58 to carrier 60 is not shown. A grinding may be performed to ensure the exposure of TVs 32. Furthermore, the back surfaces of substrates 102 of dies 100 are exposed after the grinding. The surfaces of TVs 32, substrate 102, and molding material 34 may be coplanar. Substrates 102 may also be thinned so that the resulting package has a desirable reduced thickness.

Figure 22:
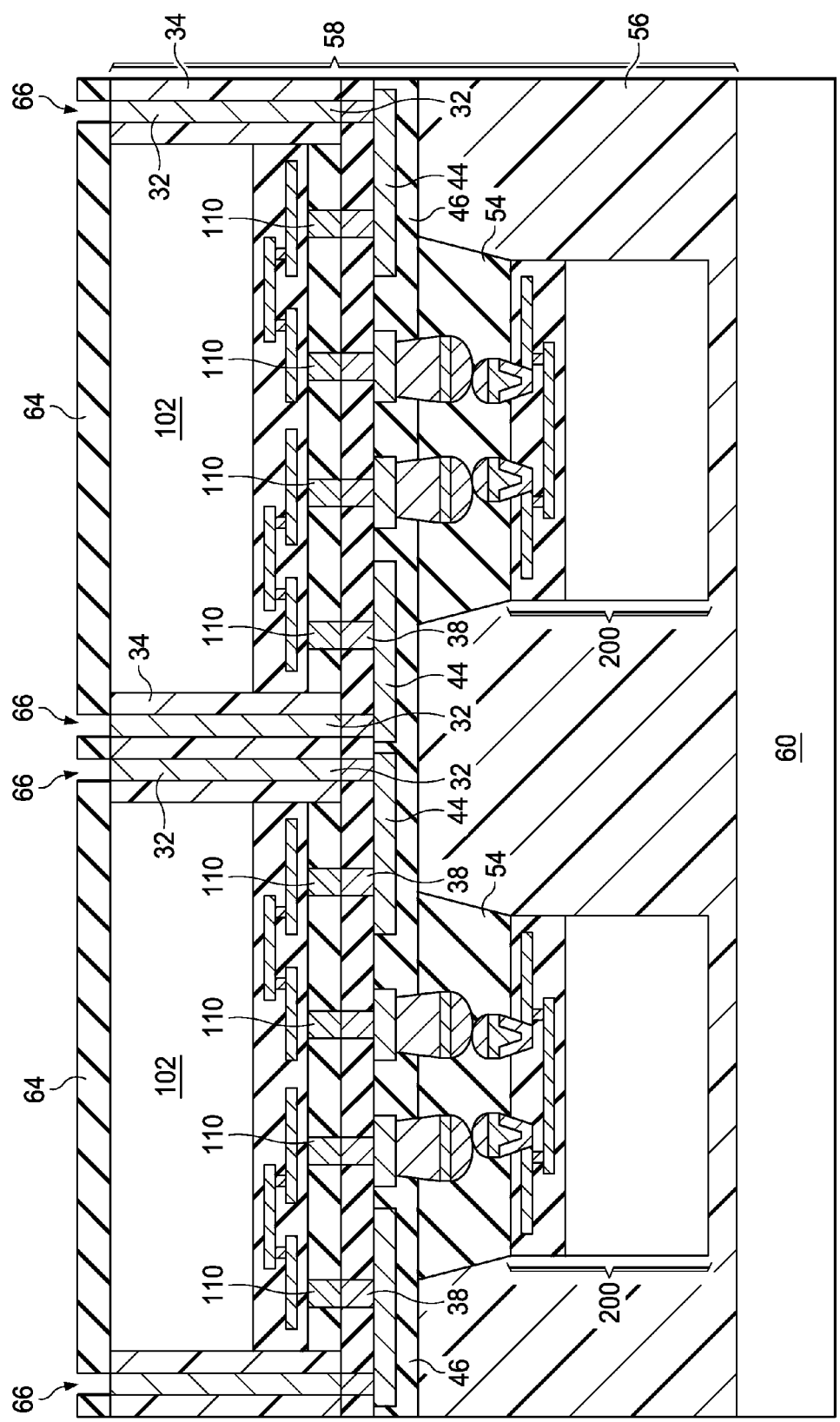
Figure 23:
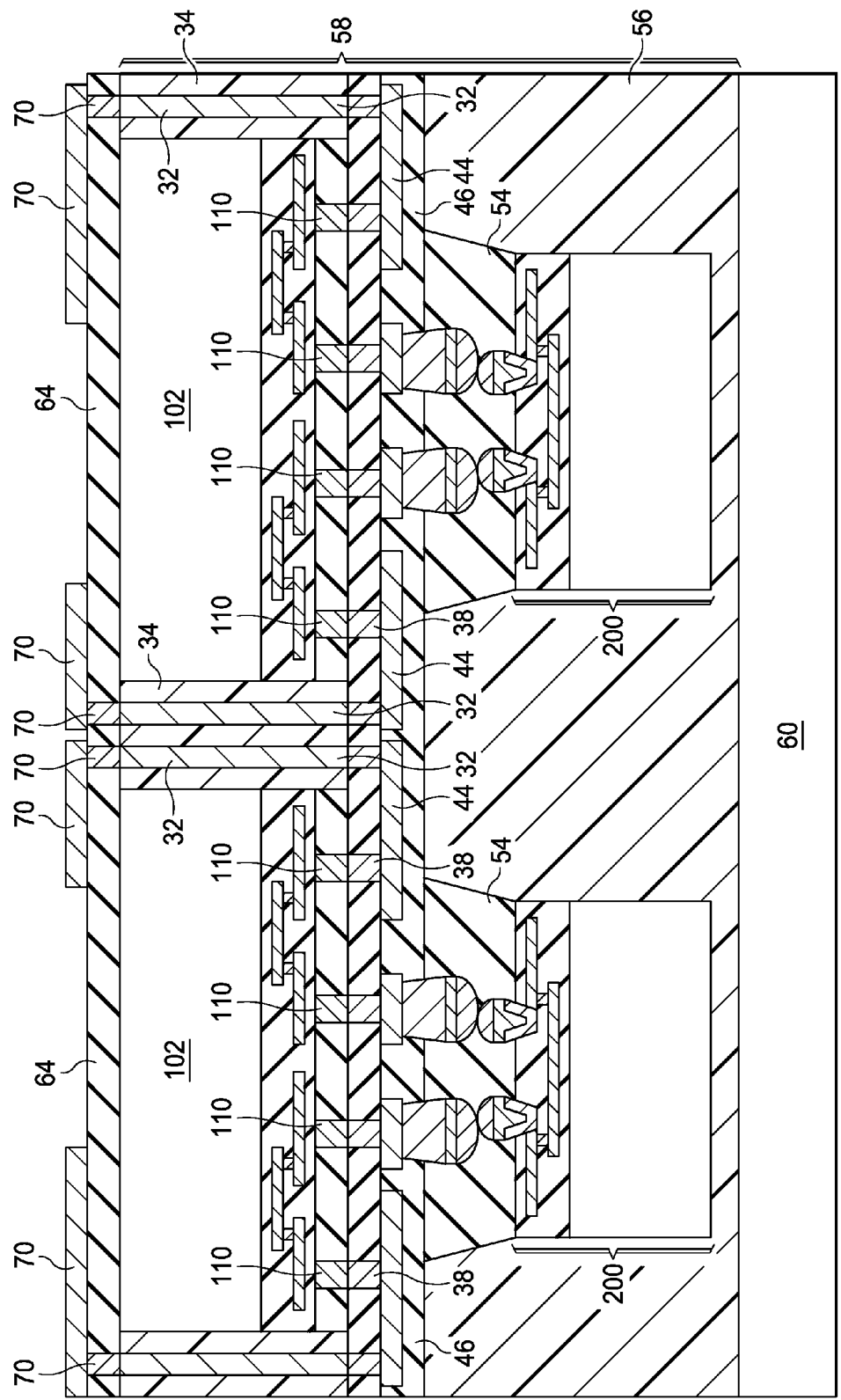

Next, referring to FIGS. 22 through 25, Redistribution Lines (RDLs) and electrical connectors are formed over molding material 34. Referring to FIG. 22, dielectric layer 64 is formed over molding material 34. In some embodiments, dielectric layer 64 is a low-temperature silicon nitride layer. In alternative embodiments, dielectric layer 64 comprises a polymer such as polyimide, BCB, PBO, or the like. Dielectric layer 64 is then patterned to form openings 66, through which TVs 32 are exposed. Next, referring to FIG. 23, RDLs 70, which comprise metal vias in openings 66 (FIG. 22), and metal lines over dielectric layer 64, are formed. RDLs 70 may be formed using the same materials and methods that may be used to form RDLs 44. RDLs 70 are electrically connected to TVs 32.

Figure 24:
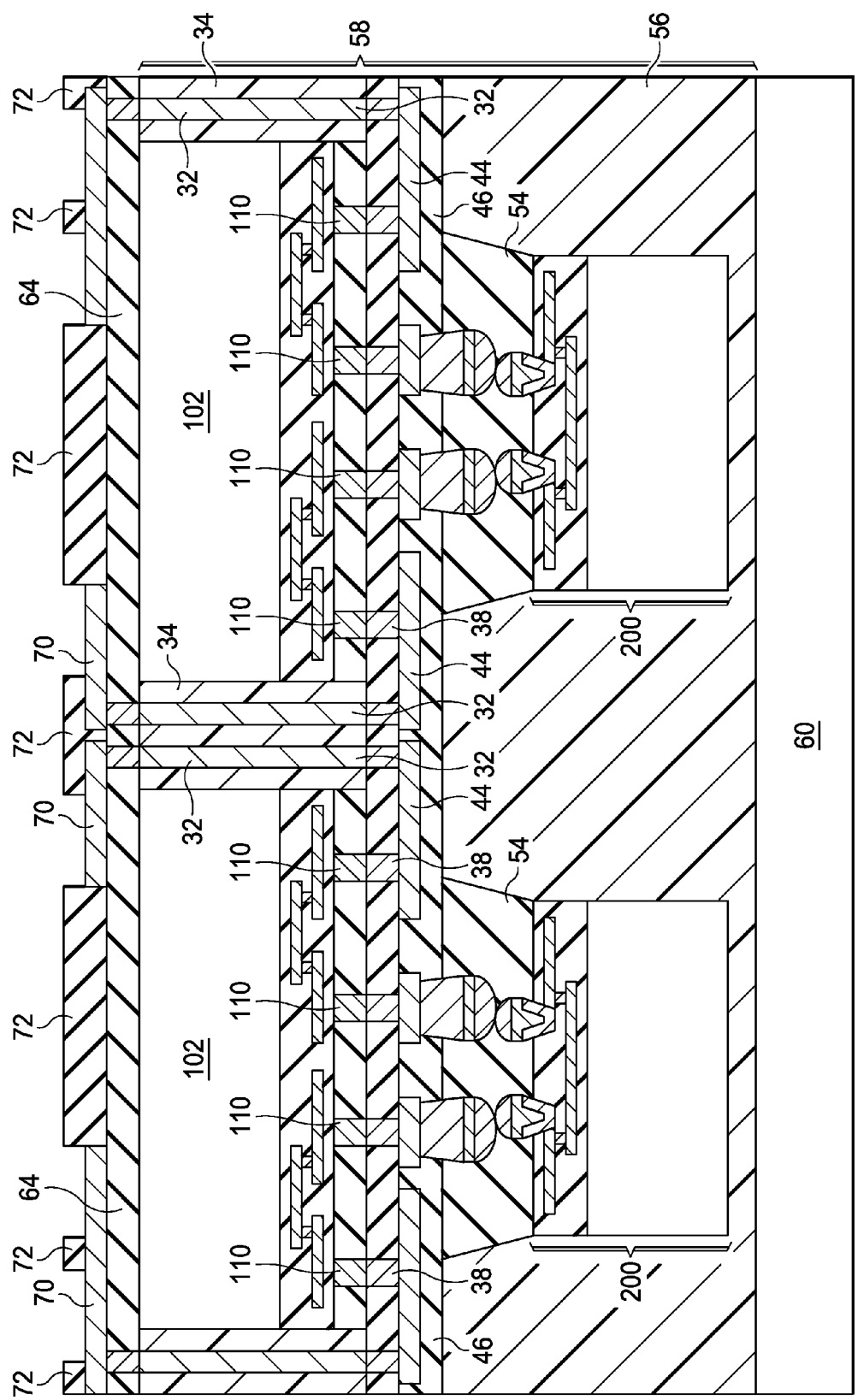
Figure 25:
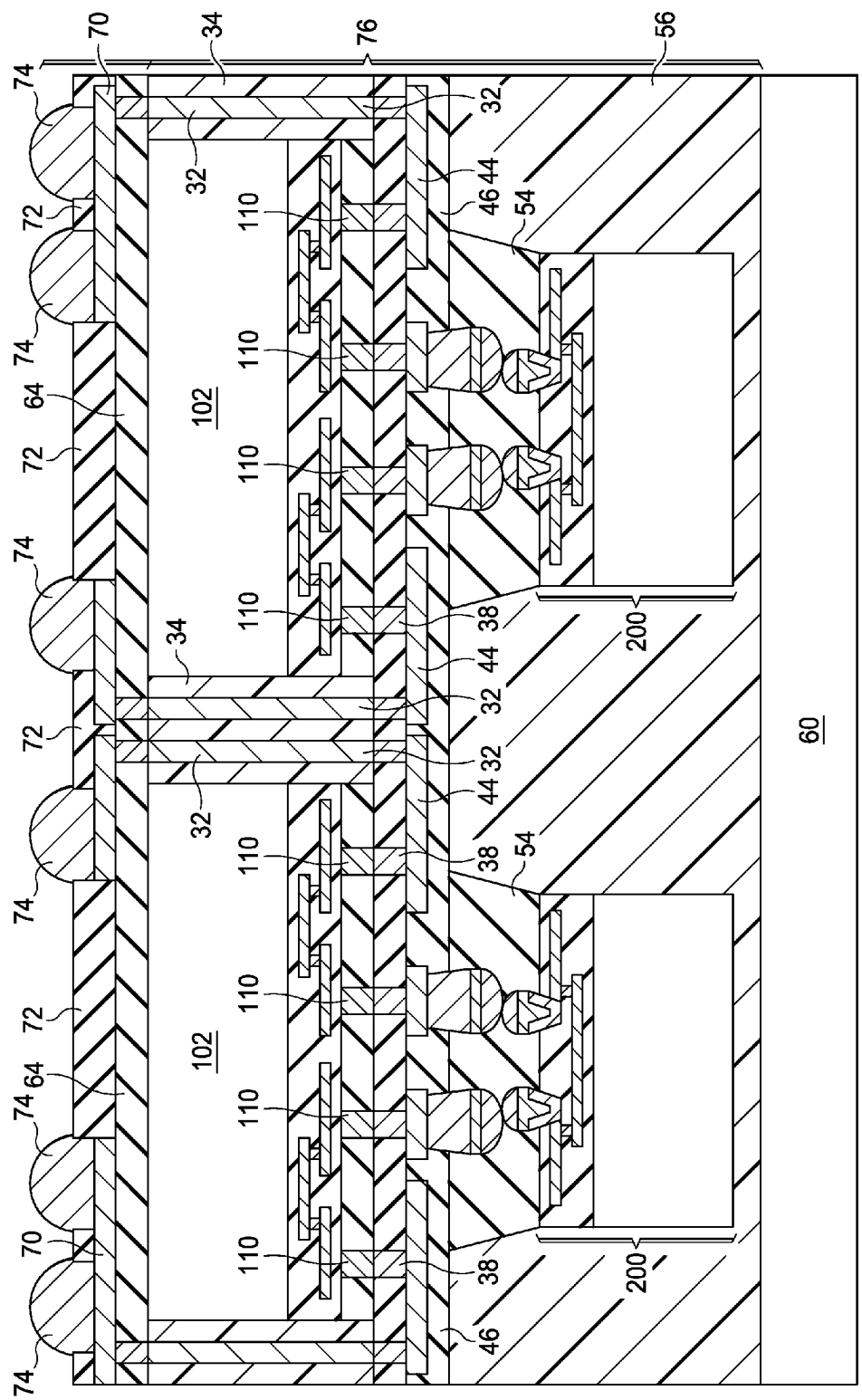

FIGS. 24 and 25 illustrate the formation of dielectric layer 72 (FIG. 24) and electrical connectors 74 (FIG. 25). Dielectric layer 72 may be formed using a material selected from the same candidate materials of dielectric layers 36 (FIG. 9). Electrical connectors 74 may be solder regions. Alternatively, electrical connectors 74 comprise lead, tin, copper, nickel, aluminum, palladium, gold, alloys thereof, and multi-layers thereof. The solder regions in electrical connectors 74 may be placed and then reflowed. Electrical connectors 74 are electrically connected to TVs 32, RDLs 44 and 70, and dies 100 and 200. Throughout the description, the structure in FIG. 25 (not including carrier 60) is referred to as package 76.

Figure 26:
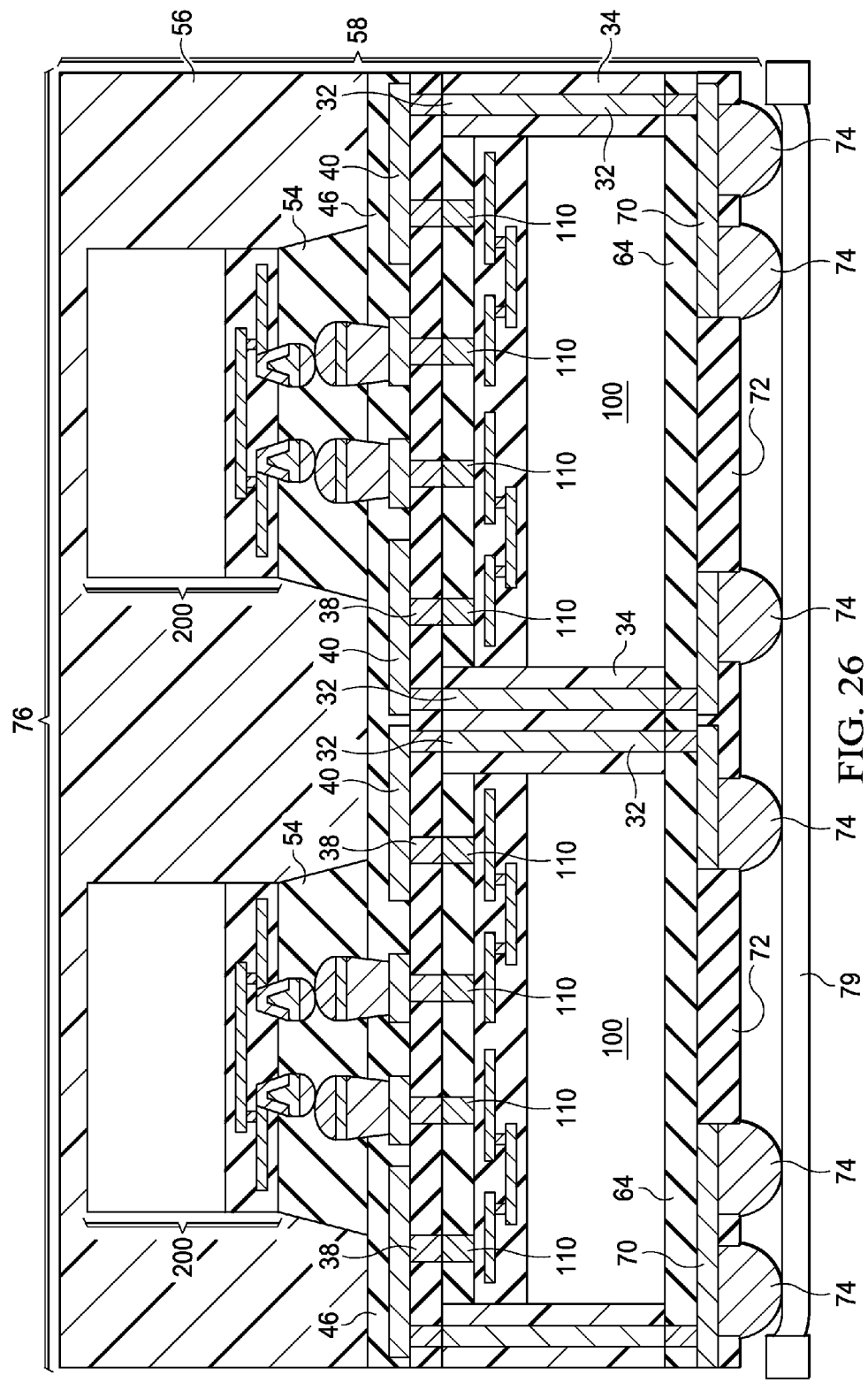
Figure 27:
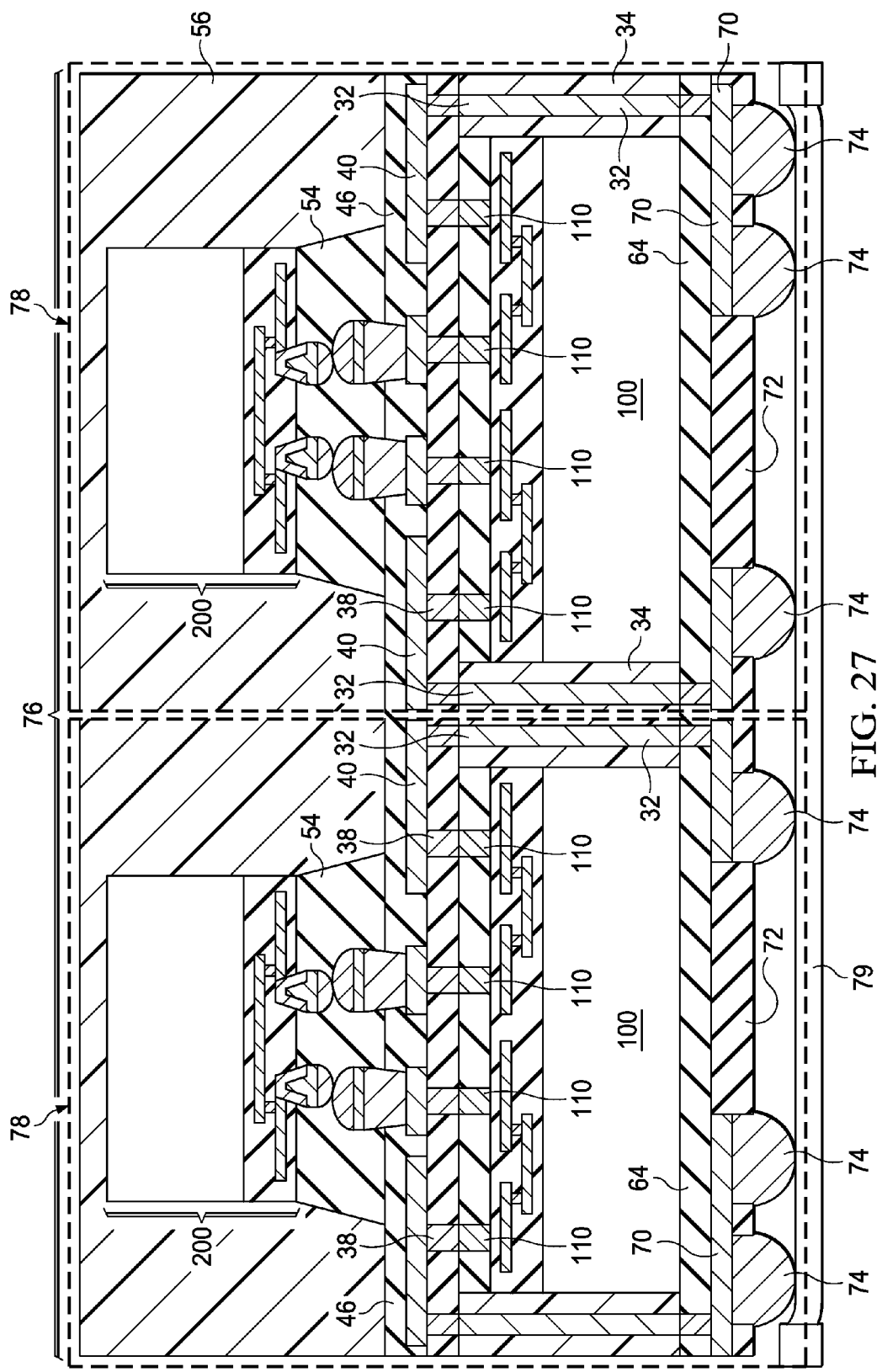

Package 76 is then detached from carrier 60 in FIG. 25, and is then attached to tape 79, as shown FIG. 26. Electrical connectors 74 may face, and may be in contact with, tape 79. Referring to FIG. 27, a die-saw is performed to separate package 76 into a plurality of packages 78, which may be identical to each other.

Figure 28:
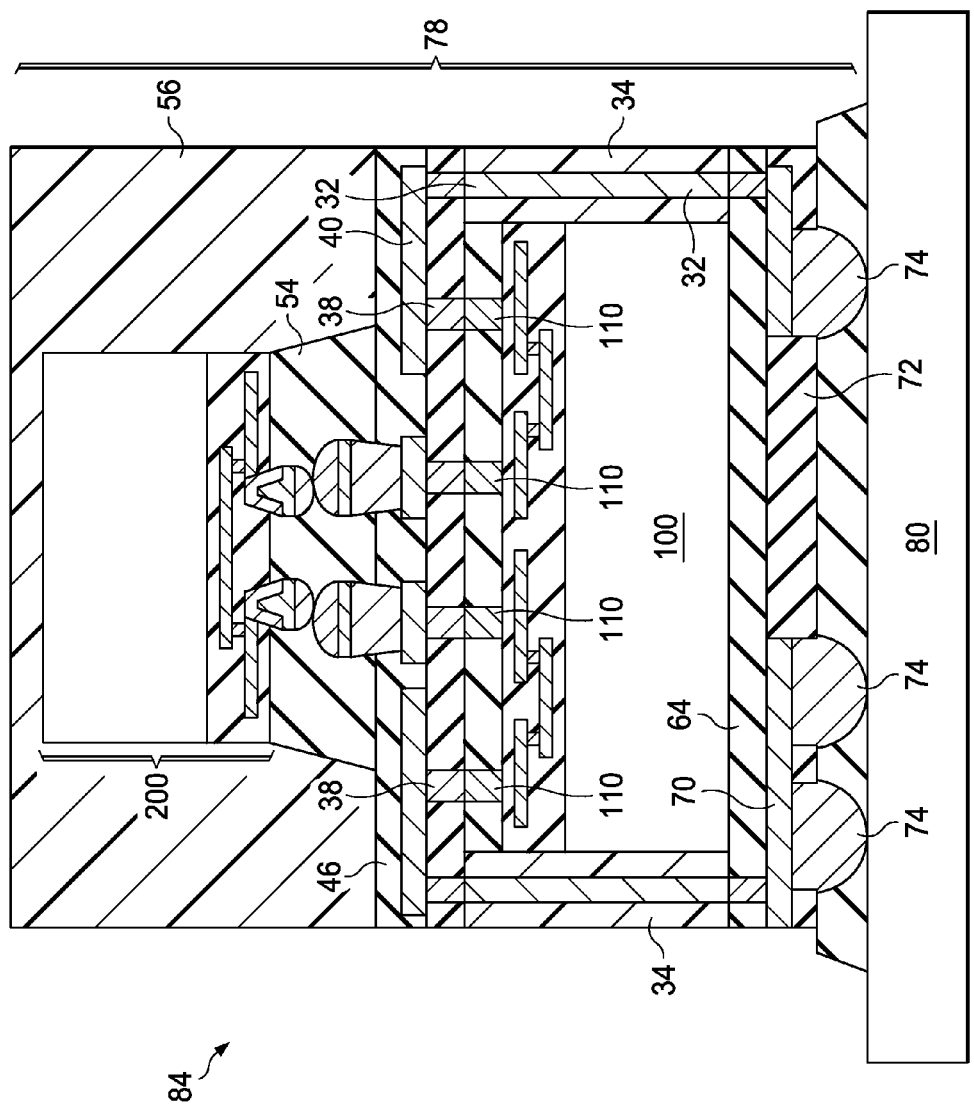
Figure 29:
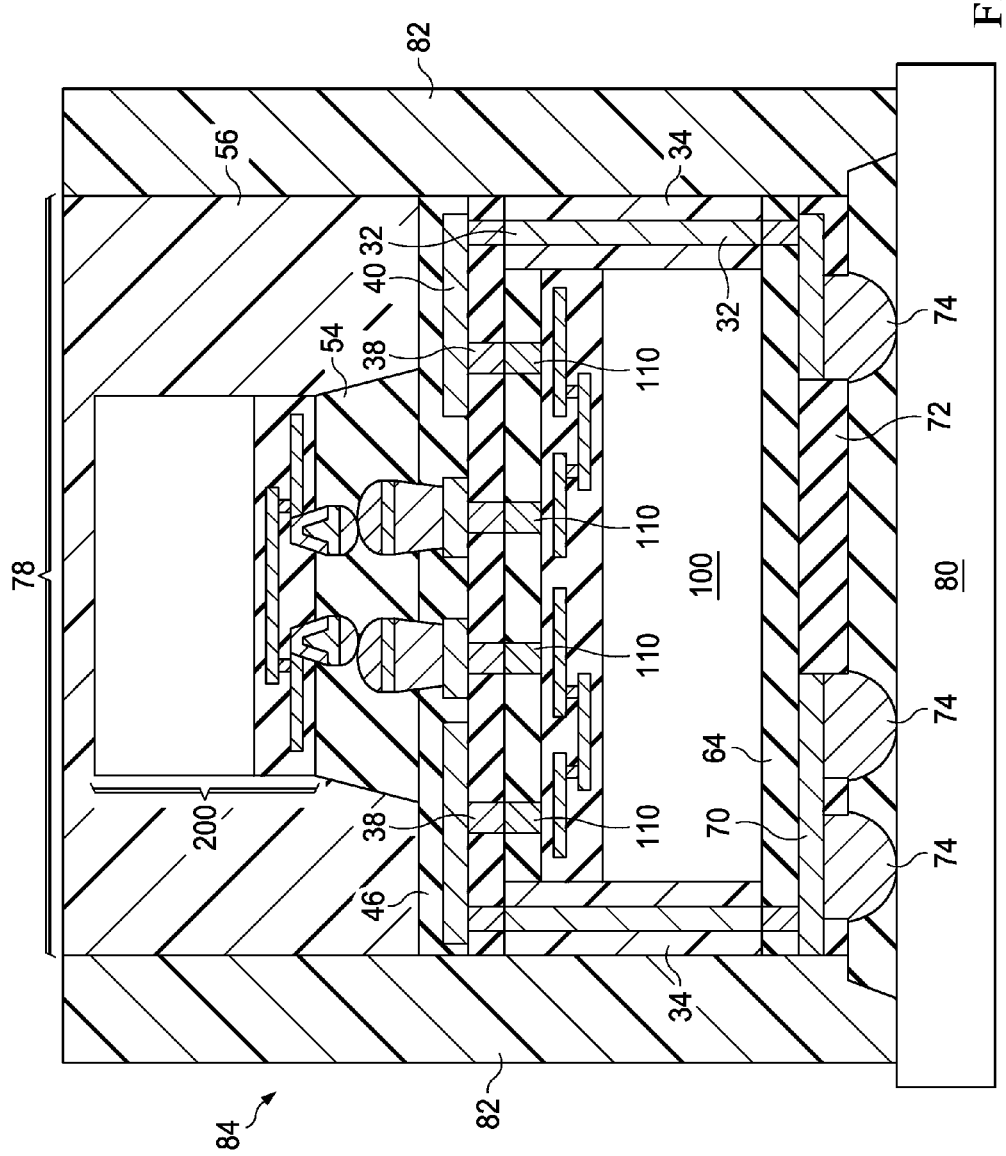

FIG. 28 illustrates the bonding of one of packages 78 to package component 80, which may be a package substrate, an interposer, or the like. In these embodiments, molding compound 82 may be used to mold package 78 therein, as shown in FIG. 29. In alternative embodiments, package component 80 may be a Printed Circuit Board (PCB).

FIG. 29 illustrates the molding of molding material 82 to package 78 in the some embodiments, for example, when package component 80 is a package substrate. Molding material 82 may be overlying package substrate 80 in these embodiments. The packages as shown in FIGS. 28 and 29 are referred to package 84.

FIGS. 30 through 36B illustrate some exemplary packages in accordance with the embodiments of the present disclosure. The formation of the packages in accordance with these embodiments may be realized through the teaching shown in FIGS. 1 through 29, and hence the formation processes are not discussed herein. The like elements in FIGS. 1 through 29 are marked in FIGS. 30 through 36B using corresponding reference notations, and hence the details of these components are not discussed in detail.

FIG. 30 schematically illustrates the package 78 as shown in FIG. 27, and FIG. 31 schematically illustrates the package 84 shown in FIG. 29, wherein some details of the package are not illustrated. FIG. 32 illustrates package 78 that includes two device dies 100 (including 100A and 100B) molded in molding material 34. Device die 100A may be identical to device die 100B, or may have a structure different from that of device die 100B. Device dies 200, which include dies 200A and 200B, are bonded to devices 100A and 100B. Device die 200A may be identical to device die 200B, or may have a structure different from that of device die 200B.

In FIG. 33, two device dies 200A and 200B are molded in molding material 56, while a single device die 100 is molded in molding material 34. Hence, device dies 200A and 200B are bonded to the same device die 100. Furthermore, device die 100 is smaller than the combined size of device dies 200A and 200B. Hence, a portion of device die 200A overlaps a first portion of device die 100, and a portion of device die 200B overlaps a second portion of device die 100. Some TVs 32 are overlapped by portions of device dies 200A and 200B. Accordingly, the chip area overlapped by device dies 200A and 200B is utilized to form TVs 32 in order to reduce the footprint of the package 84. TVs 32 may also include portions not overlapped by dies 200A and 200B.

Figure 34A:
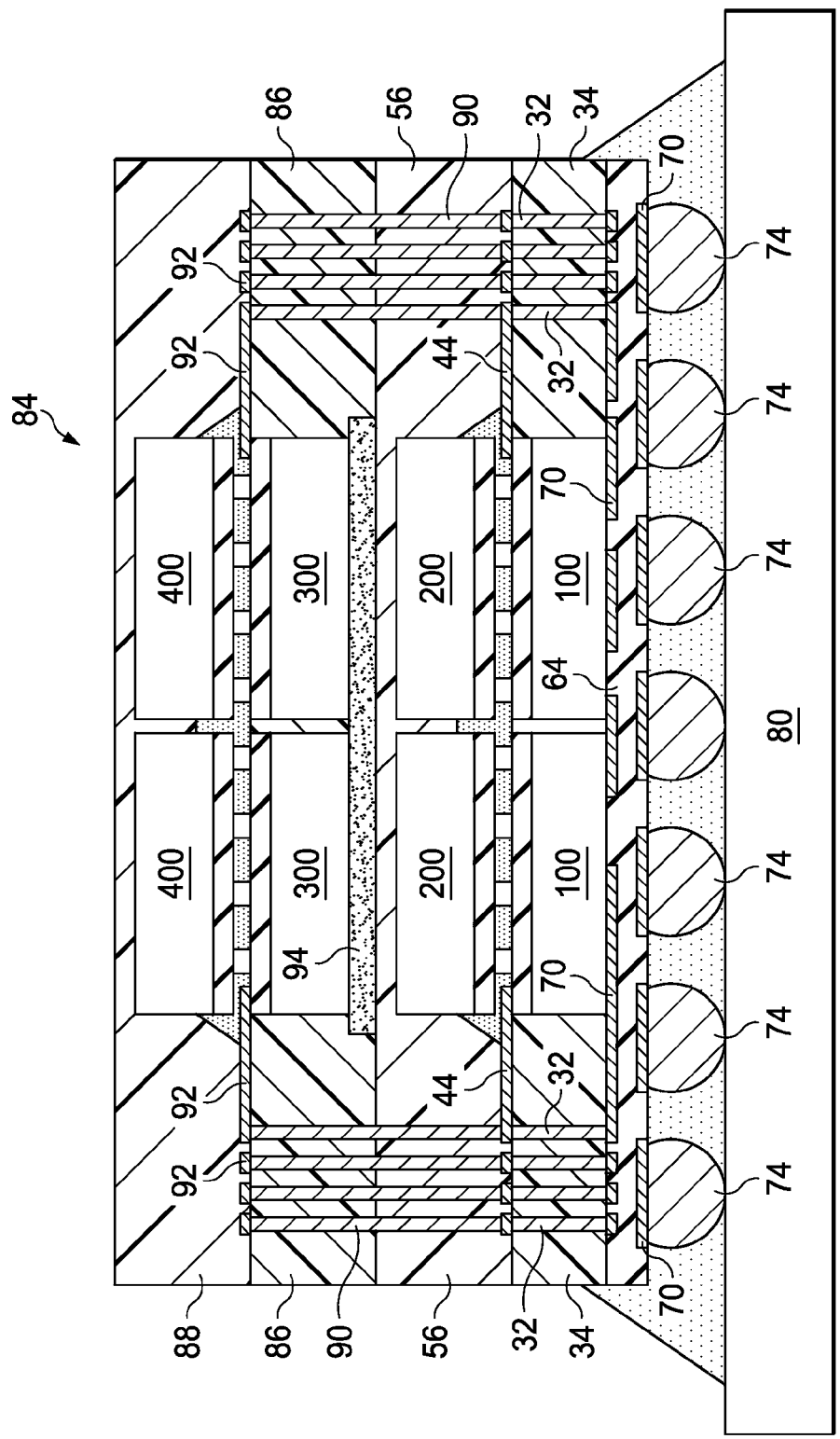

FIG. 34a illustrates yet another embodiment, wherein package 84 includes, in additional to the first tier including device(s) 100 and the second tier including device die(s) 200, also include more tiers, for example, up to 8 tiers or more. For example, in FIG. 34a, the third tier includes device dies 300 in molding material 86, and the fourth tier includes device dies 400 in molding material 88. TVs 90 are formed in molding materials 56 and 86, and RDLs 92 are also formed in molding material 88. Adhesive 94 may be disposed over molding material 56, and device dies 300 are adhered to adhesive 94. Another alternative TV formation step allows the plurality of TVs to penetrate two or more molding materials may involve hole drilling by laser machining or dry etching method to form the TV openings and then seed layer & metal plating to form the TV.

Figure 34B:
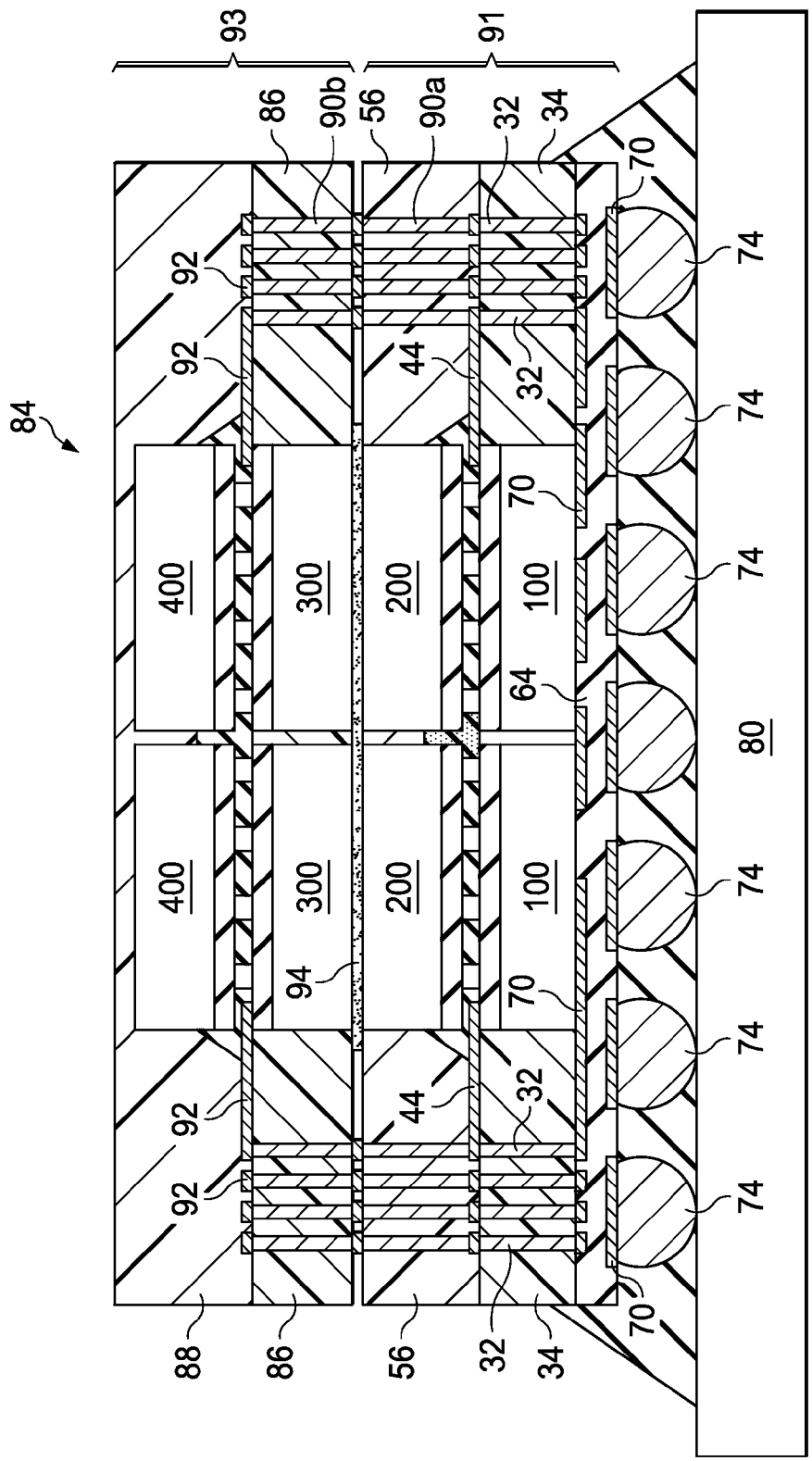

FIG. 34b illustrates yet another embodiment, wherein package 84 includes, in additional to the first tier including device(s) 100 and the second tier including device die(s) 200, also include more. These embodiments are similar to the embodiments in FIG. 34a, except that each of the molding compound that molds one tier has its own TVs such as 32, 90a, and 90b. Dies 100 and 200 may be formed first to form die stack 91, and die stack 93 (which may be pre-formed) is adhered to die stack 91 through adhesive 94.

Figure 35A:
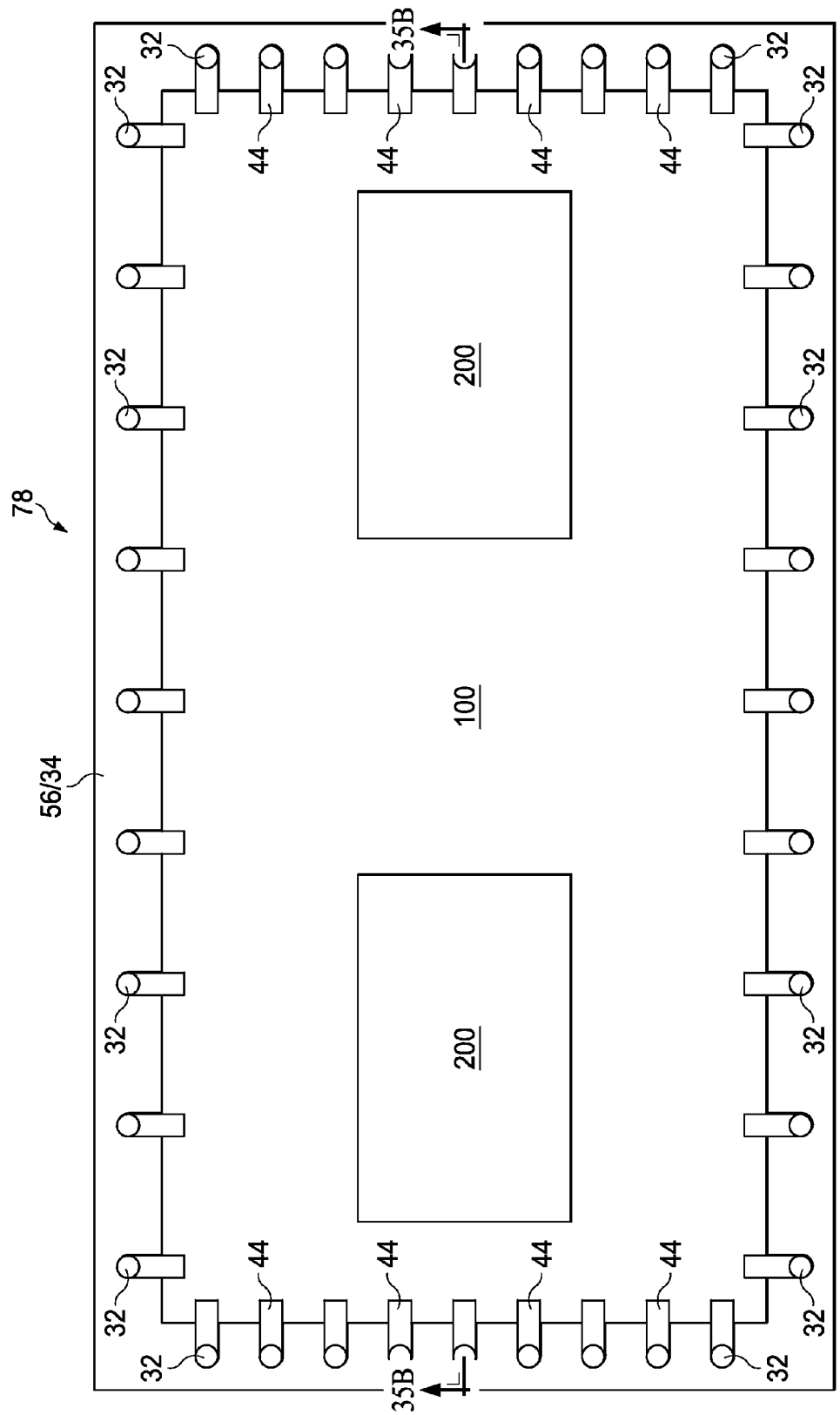
Figure 35B:
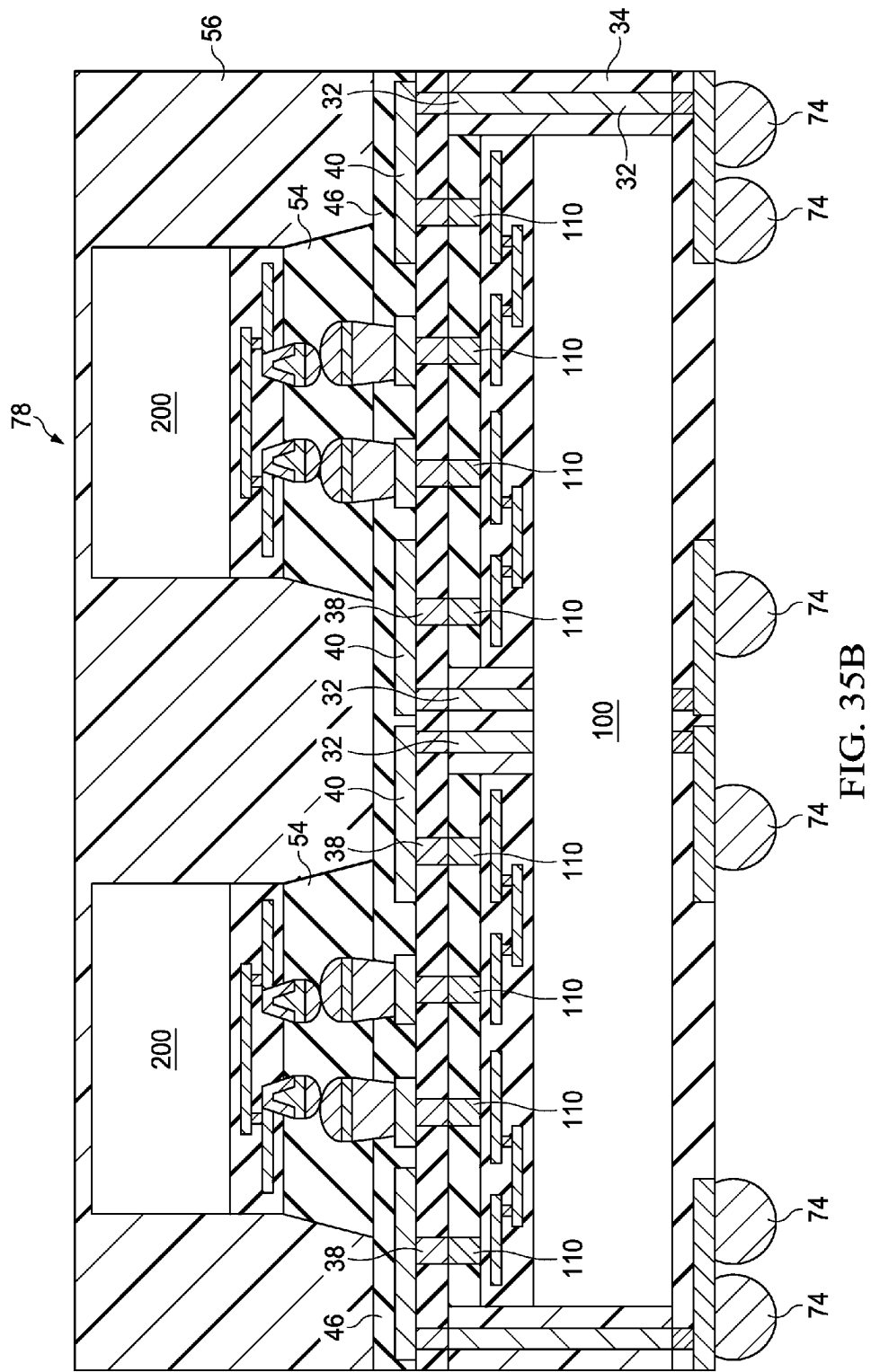

FIGS. 35A and 35B illustrate a top view and a cross-sectional view, respectively, of package 78 in accordance with yet alternative embodiments. Device dies 200 are bonded to the same device die 100 in these embodiments. As shown in FIG. 35A, TVs 32 may be aligned as a ring encircling device die 100 to optimize the distribution of RDLs 44 and TVs 32.

Figure 36A:
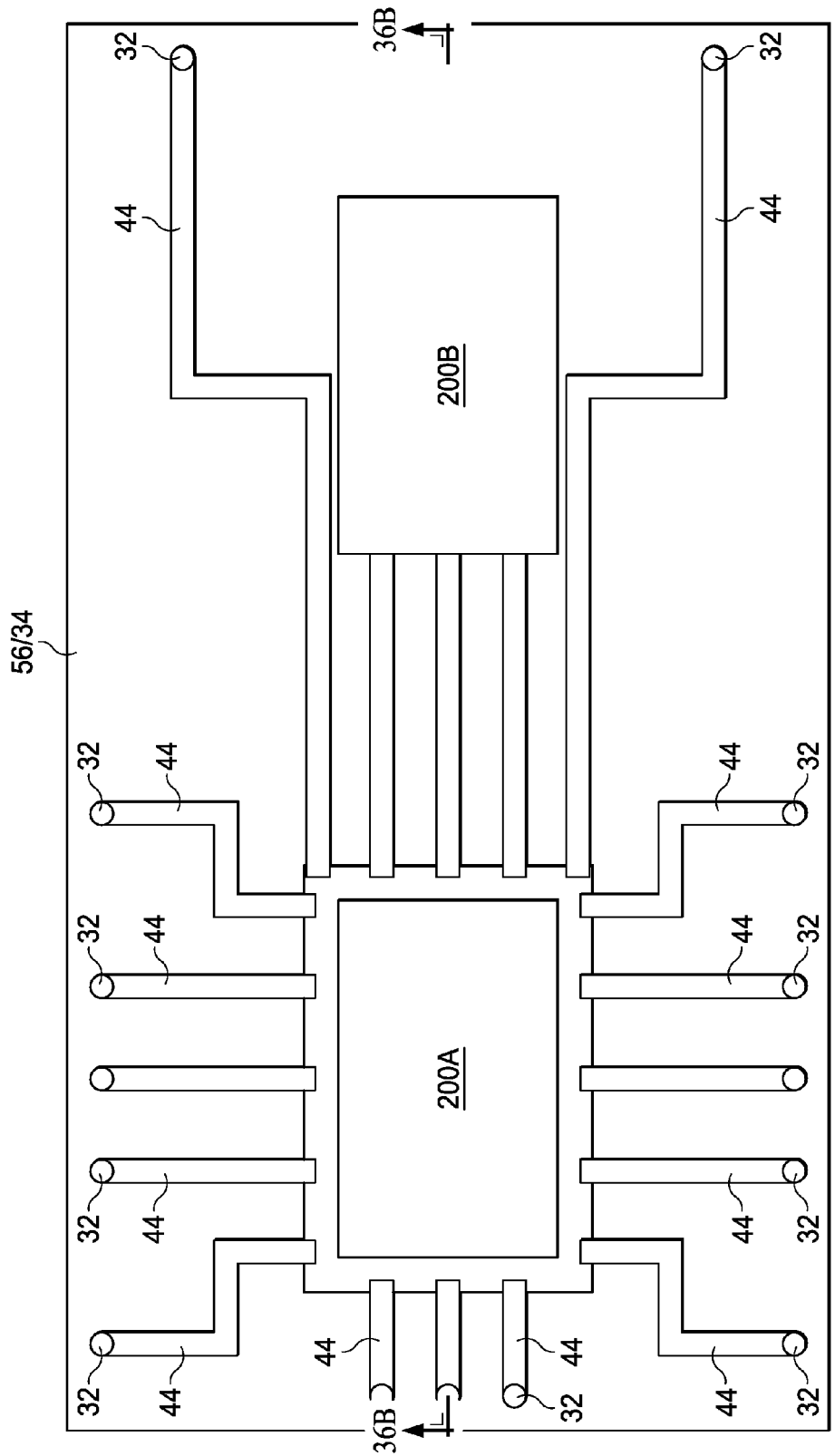
Figure 36B:
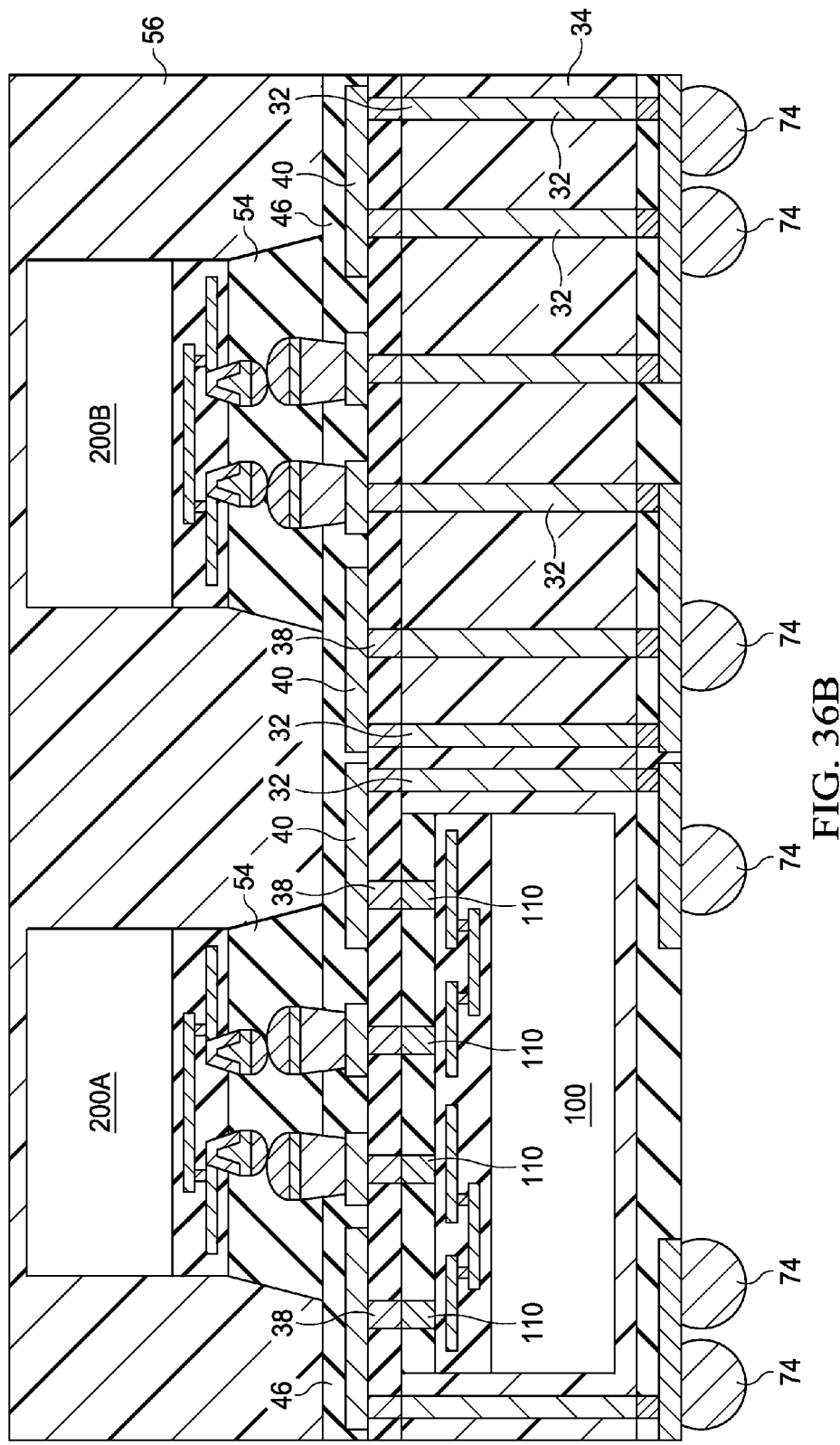

FIGS. 36A and 36B illustrate a top view and a cross-sectional view, respectively, of package 78 in accordance with yet alternative embodiments. These embodiments are similar to the embodiments in FIGS. 35A and 35B except that device die 100 is small. Device die 200A is bonded to device die 100. Device die 200B is not bonded to device die 100. However, device dies 100 and 200B are electrically interconnected through RDLs 44. In these embodiments, as shown in FIG. 36A, TVs 32 may be overlapped by device die 200B to reduce the footprint of the resulting package 78.

The embodiments of the present disclosure have some advantageous features. By forming TVs 32, which may be formed as very thin metal rods, the footprint of the resulting package is small. The resulting package is also thin due to the thinning of device dies in the formation process.

In accordance with some embodiments, a package includes a first molding material, a first device die molded in the molding material, a TV penetrating through the first molding material, and a redistribution line over the first molding material. The redistribution line is electrically connected to the first TV. A second device die is over and bonded to the first device die through flip-chip bonding. A second molding material molds the second device die therein.

In accordance with other embodiments, a package includes a first device die, and a second device die bonded to the first device die through flip-chip bonding. The first device die includes a first semiconductor substrate, a first interconnect structure overlying the first semiconductor substrate, and a first molding material molding the first device die therein. A bottom surface of the first molding material is coplanar with a bottom surface of the first semiconductor substrate. A plurality of TVs penetrates through the first molding material. The second device die includes a second semiconductor substrate, a second interconnect structure underlying the second semiconductor substrate, and a plurality of redistribution lines over the first molding material. The first plurality of redistribution lines is electrically connected to the plurality of TVs and the first device die. A second molding material molds the second device die therein.

In accordance with yet other embodiments, a method includes placing a first device die over a carrier, molding the first device die and a plurality of TVs in a first molding material, grinding the first molding material to expose first ends of the plurality of TVs and metal pillars of the first device die, forming a first plurality of redistribution lines over and electrically connected to the metal pillars and the plurality of TVs, forming electrical connectors over and electrically connected to the metal pillars, bonding a second device die to the electrical connectors, and molding the second device die in a second molding material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first molding material;
   a first device die molded in the molding material, wherein the first device die comprises:
      a metal pillar; and
      a dielectric layer, wherein a top surface of the metal pillar and a top surface of the dielectric layer are coplanar with a top surface of the first molding material;
   a Through Via (TV) penetrating through the first molding material;
   a first redistribution line over the first molding material, wherein the first redistribution line is electrically connected to the TV;
   a second device die over and bonded to the first device die through flip-chip bonding; and
   a second molding material molding the second device die therein.

2. The package of claim 1 wherein the first redistribution line is electrically connected to the first device die.

3. The package of claim 1 further comprising a second redistribution line underlying the first molding material, wherein the second redistribution line is electrically connected to the TV.

4. The package of claim 1, wherein the first molding material and the second molding material comprise different materials.

5. The package of claim 1 further comprising a third device die over and bonded to the first device die, wherein the TV is overlapped by a portion of the third device die.

6. The package of claim 1, wherein solder regions bond the first device die to the second device die, and wherein the first redistribution line is below the solder regions.

7. The package of claim 1, wherein the TV is formed of a non-solder metallic material.

8. The package of claim 1, wherein the TV has substantially a uniform shape and a uniform width from a top surface of the TV to a bottom surface of the TV, and wherein the bottom surface of the TV is coplanar with a back surface of a semiconductor substrate of the first device die.

9. A package comprising:
   a first device die comprising:
      a first semiconductor substrate;
      a first interconnect structure overlying the first semiconductor substrate;
      a metal pillar; and
      a dielectric layer;
   a first molding material molding the first device die therein, wherein a bottom surface of the first molding material is coplanar with a bottom surface of the first semiconductor substrate, and a top surface of the metal pillar and a top surface of the dielectric layer are coplanar with a top surface of the first molding material;
   a first plurality of Through Vias (TVs) penetrating through the first molding material;
   a second device die bonded to the first device die through flip-chip bonding, the second device die comprising:
      a second semiconductor substrate; and
      a second interconnect structure underlying the second semiconductor substrate;
   a first plurality of redistribution lines over the first molding material, wherein the first plurality of redistribution lines is electrically connected to the first plurality of TVs and the first device die; and
   a second molding material molding the second device die therein.

10. The package of claim 9, wherein the first plurality of TVs is formed of a non-solder metallic material.

11. The package of claim 9 further comprising a second plurality of redistribution lines underlying the first molding material, wherein the second plurality of redistribution lines is electrically connected to the first plurality of TVs.

12. The package of claim 9 further comprising:
   an adhesive over and in contact with the second device die;
   a third device die having a back surface adhered to the adhesive;
   a third molding material molding the adhesive and the third device die therein;
   a second plurality of TVs penetrating through the second molding material and the third molding material; and
   a second plurality of redistribution lines over the third molding material and electrically connected to the second plurality of TVs.

13. The package of claim 12 further comprising:
   a fourth device die over and bonded to the third device die through flip-chip bonding; and
   a fourth molding material molding the fourth device die therein.

14. The package of claim 9, wherein the first molding material and the second molding material are different from each other.

15. A package comprising:
   a first device die comprising:
      a first semiconductor substrate; and
      a first interconnect structure overlying the first semiconductor substrate;
   a first molding material molding the first device die therein, wherein a bottom surface of the first molding material is coplanar with a bottom surface of the first semiconductor substrate;
   a first plurality of Through Vias (TVs) penetrating through the first molding material;

a second device die bonded to the first device die through flip-chip bonding, the second device die comprising:
  a second semiconductor substrate; and
  a second interconnect structure underlying the second semiconductor substrate;
a first plurality of redistribution lines over the first molding material, wherein the first plurality of redistribution lines is electrically connected to the first plurality of TVs and the first device die;
a second molding material molding the second device die therein;
an adhesive over and in contact with the second device die;
a third device die having a back surface adhered to the adhesive;
a third molding material molding the adhesive and the third device die therein;
a second plurality of TVs penetrating through the second molding material and the third molding material; and
a second plurality of redistribution lines over the third molding material and electrically connected to the second plurality of TVs.

16. The package of claim 15, wherein the first plurality of TVs is formed of a non-solder metallic material.

17. The package of claim 15, wherein the first device die comprises:
  a metal pillar; and
  a dielectric layer, wherein a top surface of the metal pillar and a top surface of the dielectric layer are coplanar with a top surface of the first molding material.

18. The package of claim 15 further comprising a second plurality of redistribution lines underlying the first molding material, wherein the second plurality of redistribution lines is electrically connected to the first plurality of TVs.

19. The package of claim 15 further comprising:
  a fourth device die over and bonded to the third device die through flip-chip bonding; and
  a fourth molding material molding the fourth device die therein.

20. The package of claim 15, wherein the first molding material and the second molding material are different from each other.

* * * * *